(12) United States Patent
Uemura et al.

(10) Patent No.: US 9,640,508 B2
(45) Date of Patent: May 2, 2017

(54) ELECTRICAL APPARATUS

(71) Applicant: FUJITSU LIMITED, Kawasaki-shi, Kanagawa (JP)

(72) Inventors: Taiki Uemura, Kawasaki (JP); Kozo Shimizu, Atsugi (JP); Seiki Sakuyama, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/885,356

(22) Filed: Oct. 16, 2015

(65) Prior Publication Data

US 2016/0133595 A1 May 12, 2016

(30) Foreign Application Priority Data

Nov. 12, 2014 (JP) .................. 2014-230129

(51) Int. Cl.
*H01L 23/00* (2006.01)
*B23K 35/26* (2006.01)
*H01L 23/498* (2006.01)
*H05K 3/34* (2006.01)

(52) U.S. Cl.
CPC ............. *H01L 24/81* (2013.01); *B23K 35/26* (2013.01); *H01L 23/49816* (2013.01); *H01L 24/13* (2013.01); *H01L 24/16* (2013.01); *H01L 24/92* (2013.01); *H05K 3/3463* (2013.01); *H01L 23/49827* (2013.01); *H01L 24/05* (2013.01); *H01L 24/29* (2013.01); *H01L 24/32* (2013.01); *H01L 24/73* (2013.01); *H01L 24/75* (2013.01); *H01L 24/83* (2013.01); *H01L 2224/0401* (2013.01); *H01L 2224/05082* (2013.01); *H01L 2224/05147* (2013.01); *H01L 2224/05155* (2013.01); *H01L 2224/05644* (2013.01); *H01L 2224/13023* (2013.01); *H01L 2224/13109* (2013.01); *H01L 2224/16227* (2013.01); *H01L 2224/16238* (2013.01); *H01L 2224/16507* (2013.01); *H01L 2224/2919* (2013.01); *H01L 2224/32058* (2013.01); *H01L 2224/32225* (2013.01); *H01L 2224/73204* (2013.01);

(Continued)

(58) Field of Classification Search
None
See application file for complete search history.

(56) References Cited

U.S. PATENT DOCUMENTS

| | | | |
|---|---|---|---|
| 5,897,341 A * | 4/1999 | Love | H01L 24/81 257/E21.511 |
| 6,550,665 B1 * | 4/2003 | Parrish | B23K 35/26 228/180.21 |

(Continued)

FOREIGN PATENT DOCUMENTS

| | | |
|---|---|---|
| JP | S61-148774 | 7/1986 |
| JP | 2002-124533 A1 | 4/2002 |
| JP | 2006-909 A1 | 1/2006 |
| WO | 2009011392 A1 | 1/2009 |

*Primary Examiner* — Bilkis Jahan
(74) *Attorney, Agent, or Firm* — Kratz, Quintos & Hanson, LLP

(57) ABSTRACT

An electrical apparatus includes a first electrical component; a second electrical component; and an In—Sn—Ag alloy connecting the first electrical component and the second electrical component, the In—Sn—Ag alloy containing $AgIn_2$ and $Ag_2In$, a $Ag_2In$ content being lower than a $AgIn_2$ content.

17 Claims, 26 Drawing Sheets

(52) U.S. Cl.
CPC ............ *H01L 2224/75702* (2013.01); *H01L 2224/81011* (2013.01); *H01L 2224/81098* (2013.01); *H01L 2224/81192* (2013.01); *H01L 2224/81211* (2013.01); *H01L 2224/81444* (2013.01); *H01L 2224/81815* (2013.01); *H01L 2224/81907* (2013.01); *H01L 2224/81948* (2013.01); *H01L 2224/83104* (2013.01); *H01L 2224/92125* (2013.01); *H01L 2924/0133* (2013.01); *H01L 2924/20104* (2013.01); *H05K 3/3436* (2013.01); *H05K 2201/10674* (2013.01); *H05K 2203/047* (2013.01)

(56) References Cited

U.S. PATENT DOCUMENTS

| | | | |
|---|---|---|---|
| 2009/0200652 A1* | 8/2009 | Oh | H01L 25/0657 257/686 |
| 2010/0307823 A1 | 12/2010 | Kawamata | |
| 2011/0070122 A1* | 3/2011 | Tsao | B22F 3/18 420/502 |
| 2012/0211276 A1* | 8/2012 | Blais | B23K 1/0016 174/75 R |
| 2013/0113094 A1* | 5/2013 | Wu | H01L 23/3171 257/737 |
| 2013/0187277 A1* | 7/2013 | Chen | H01L 24/13 257/762 |
| 2014/0291819 A1* | 10/2014 | Barth | H01L 23/53276 257/659 |

\* cited by examiner

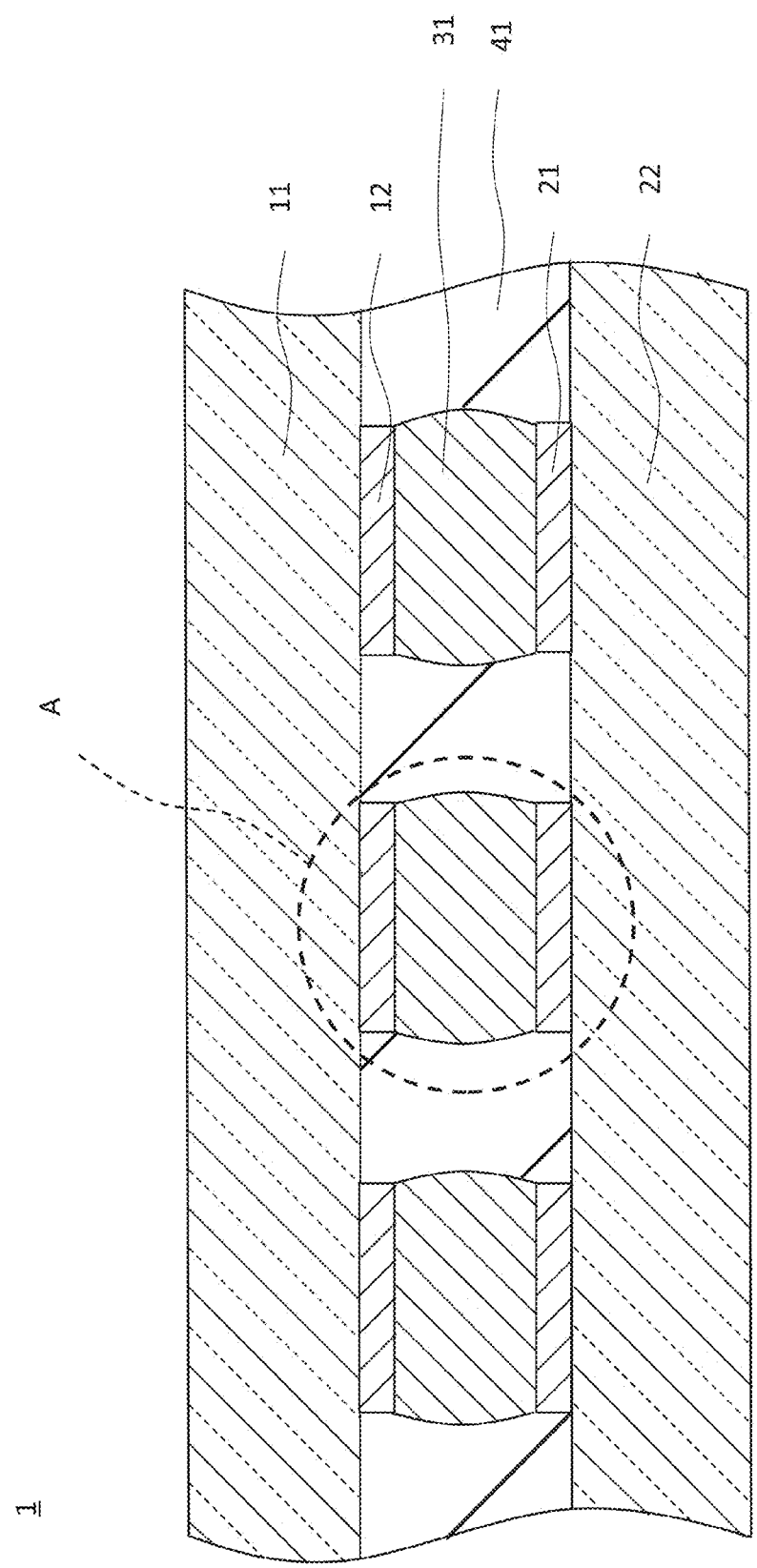

FIG. 22

|  | Ag$_2$In (wt%) | AgIn$_2$ (wt%) | In (wt%) |
|---|---|---|---|
| In-Sn-1Ag | 0.0001 | 2~4 | 51.5 |
| In-Sn-3Ag | 0.1 | 7~9 | 50.5 |
| In-Sn-5Ag | 3.5~4.5 | 2~3 | 49.5 |

FIG. 23

|  | STRENGTH (MAXIMUM LOAD) [g] | DUCTILITY (DISPLACEMENT) [μm] |
|---|---|---|
| In-Sn | 667 | 341 |
| In-Sn-1Ag | 725 | 413 |
| In-Sn-3Ag | 787 | 354 |
| In-Sn-5Ag | 809 | 255 |

…

ELECTRICAL APPARATUS

CROSS-REFERENCE TO RELATED APPLICATION

This application is based upon and claims the benefit of priority of the prior Japanese Patent Application No. 2014-230129, filed on Nov. 12, 2014, the entire contents of which are incorporated herein by reference.

FIELD

The embodiments discussed herein are related to an electrical apparatus in which electrical components are mounted with a bonding material and a method for manufacturing the electrical apparatus.

BACKGROUND

In general, because of their high workability and productivity, mounting methods utilizing soldering are widely used to mount electrical components, such as semiconductor devices on printed wiring boards. When a semiconductor device is mounted on a printed wiring board by soldering, high reflow temperatures cause warping of the semiconductor device and printed wiring board, thus resulting in poor reliability of the mechanical and electrical connection of a solder bonding portion between the semiconductor device and the printed wiring board of the electrical apparatus. Thus, semiconductor devices are soldered to printed wiring boards at low reflow temperatures using solder materials having low melting points. One solder material having a low melting point is an InSn eutectic solder that has a melting point of 117° C. In—Sn alloy solder materials have lower melting points but lower strength than Sn—Bi alloy and Sn—Ag—Cu alloy solder materials. It is proposed that a solder material having a low melting point contains an intermetallic compound in order to increase the strength of the solder material (see, for example, Japanese Laid-open Patent Publications No. 2006-909 and No. 2002-124533). However, even when electrical components are mounted with the solder materials described above, for example, because of insufficient resistance to drop impact on the electrical components, electrical apparatuses have poor reliability of mechanical and electrical connection between the electrical components.

SUMMARY

According to an aspect of the invention, an apparatus includes a first electrical component; a second electrical component; and an In—Sn—Ag alloy connecting the first electrical component and the second electrical component, the In—Sn—Ag alloy containing $AgIn_2$ and $Ag_2In$, a $Ag_2In$ content being lower than a $AgIn_2$ content.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A is a cross-sectional view of an electrical apparatus according to a first embodiment;

FIG. 22 is a table listing the In, AgIn$_2$, and Ag$_2$In contents of the In—Sn-1Ag alloy, In—Sn-3Ag alloy, and In—Sn-5Ag alloy after the reflow; and FIG. 23 is a table listing the strength and ductility of the In—Sn eutectic solder, In—Sn-1Ag alloy, In—Sn-3Ag alloy, and In—Sn-5Ag alloy after the reflow.

DESCRIPTION OF EMBODIMENTS

Figure 1B:
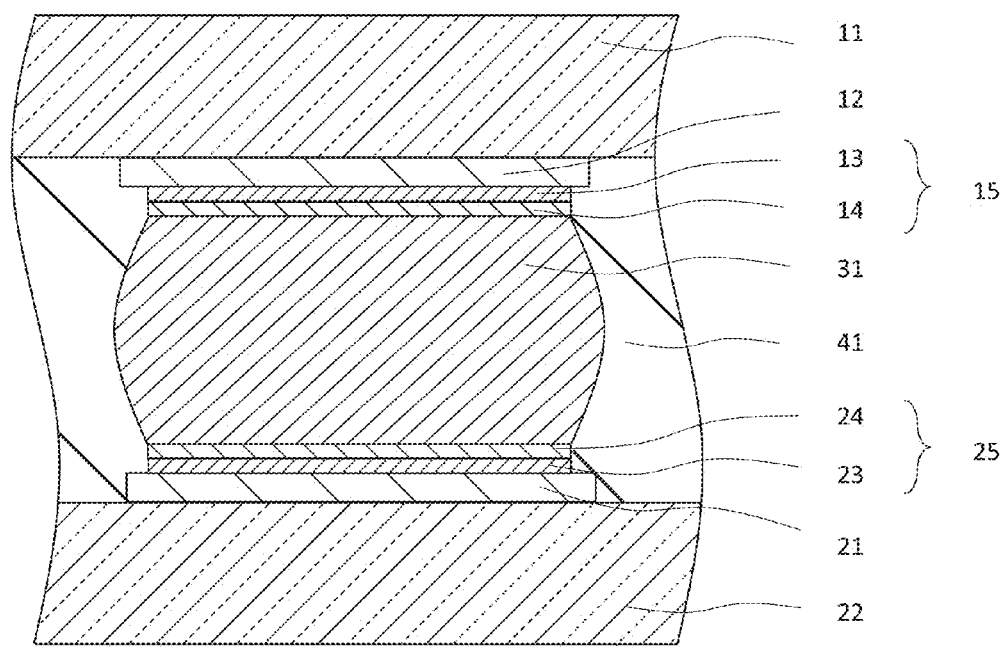
FIG. 1B is an enlarged view of a portion surrounded by the dotted line A in FIG. 1A.

The embodiments discussed herein will be described in detail below with reference to the accompanying drawings.

(First Embodiment) The structure of an electrical apparatus according to a first embodiment will be described below with reference to FIG. 1. FIGS. 1A and 1B are cross-sectional views of the electrical apparatus according to the first embodiment.

Referring to FIG. 1A, the electrical apparatus 1 according to the first embodiment includes a semiconductor device 11, an electrode 12 at the semiconductor device 11, a circuit board 22, an electrode 21 on the circuit board 22, a bonding portion 31, and an underfill 41. In the electrical apparatus 1, the semiconductor device 11 is electrically connected to the circuit board 22 via the electrode 12, the bonding portion 31, and the electrode 21. The space between the semiconductor device 11 and the circuit board 22 is filled with the underfill 41.

FIG. 1B is an enlarged view of a portion surrounded by the dotted line A in FIG. 1A. A barrier metal film 15 is disposed on the electrode 12 made of Cu, which is disposed on a surface of the semiconductor device 11. The barrier metal film 15 includes a Ni film 13 and a Au film 14 on the Cu electrode 12 in this order. A barrier metal film 25 is disposed on the electrode 21 made of Cu, which is disposed on a surface of the circuit board 22. The barrier metal film 25 includes a Ni film 23 and a Au film 24 on the Cu electrode 21 in this order. The barrier metal film 15 and the barrier metal film 25 on the Cu electrode 12 and the Cu electrode 21 can suppress the diffusion of a connection medium 32 into the Cu electrode 12 and the Cu electrode 21 and thereby improve the reliability of connection of the bonding portion 31.

The bonding portion 31 is composed of an In—Sn—Ag alloy containing an intermetallic compound Ag$_2$In and an intermetallic compound AgIn$_2$. The Ag$_2$In content of the bonding portion 31 is lower than the AgIn$_2$ content of the bonding portion 31. When the Ag$_2$In content and the AgIn$_2$ content satisfy this condition, the bonding portion 31 has high strength and ductility. The bonding portion 31 preferably contains not less than 43% and not more than 60% by weight In because this further increases the strength of the bonding portion 31. The bonding portion 31 preferably contains 3% or less by weight Ag because this further increases the strength and ductility of the bonding portion 31.

If the In content of the bonding portion 31 is less than 43% by weight, the bonding portion 31 contains grown Ag$_2$In in a larger amount than finely dispersed AgIn$_2$ and has insufficient ductility. If the In content of the bonding portion 31 is more than 60% by weight, a metallographic structure in the bonding portion 31 is not an eutectic metallographic structure of an In phase and a Sn phase, and a metallographic structure of an In phase in which Sn is dissolved in In grows. Thus, the bonding portion 31 has insufficient strength.

The In content of the bonding portion 31 more preferably ranges from not less than 48% and not more than 58% by weight, particularly preferably not less than 50% and not more than 54% by weight, in terms of high strength and ductility of the bonding portion 31.

The relationship between the composition of the bonding material of the bonding portion 31, the intermetallic compounds in the bonding portion 31, and the strength and ductility of the bonding portion 31 was examined in the following experiment.

One method for evaluating the reliability of connection is a tensile test of metallic materials according to the International Organization for Standardization standard ISO 6892-1. In this evaluation test method, the strength and ductility of bonding materials are measured by applying tensile strains to the bonding materials until the bonding materials are broken. Strength and ductility were measured by the evaluation test method.

The following bonding materials (1) to (4) were heated to a peak temperature of 150° C. and were then cooled to prepare tensile test specimens having a width of 5 mm in a cross section of a parallel portion, a thickness of 4 mm, and a gauge length of 20 mm.

Figure 2:
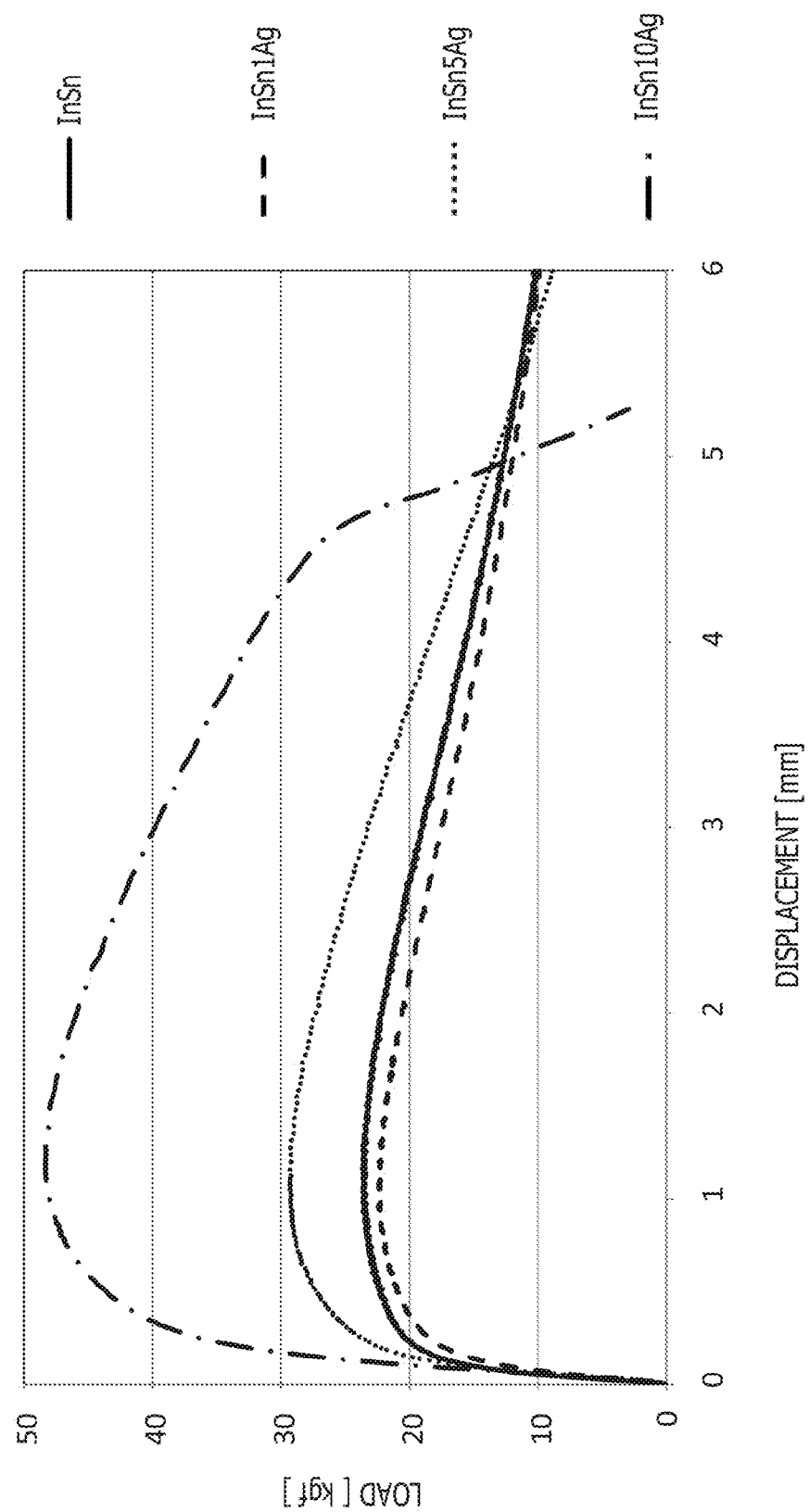
FIG. 2 is a graph of the tensile test results for In—Sn—Ag alloys having Ag contents of 0%, 1%, 5%, and 10% by weight.

(1) In-48Sn eutectic solder
(2) In—Sn-1Ag alloy composed of the In-48Sn eutectic solder and 1% by weight Ag
(3) In—Sn-5Ag alloy composed of the In-48Sn eutectic solder and 5% by weight Ag
(4) In—Sn-10Ag alloy composed of the In-48Sn eutectic solder and 10% by weight Ag The specimens were subjected to a tensile test using an INSTRON tensile tester 4466 at a crosshead speed of 2 mm/min. FIG. 2 is a graph of the tensile test results for the specimens. The tensile test conformed to the standard ISO 6892-1. In FIG. 2, the horizontal axis is the strain (displacement) of a bonding material, and the vertical axis is the load applied to the bonding material. In the graph of FIG. 2, the maximum value on the vertical axis corresponds to the strength of the bonding material. In the graph of FIG. 2, when the load applied to the bonding material decreases drastically as the strain increases, the bonding material breaks. The strain at the point in time when the bonding material breaks corresponds to ductility.

In FIG. 2, the load in the In—Sn-10Ag alloy drastically decreases at a displacement of approximately 4.6 mm. On the other hand, the load in the In-48Sn eutectic solder, In—Sn-1Ag alloy, and In—Sn-5Ag alloy drastically decreases at a displacement outside the range of FIG. 2.

It was found from the graph of FIG. 2 that the In—Sn-10Ag alloy had the highest strength among the bonding materials subjected to the tensile test and had very low ductility. In contrast, the In—Sn-1Ag alloy had the lowest strength among the bonding materials subjected to the tensile test. It was also found that the strain at break of the In—Sn-1Ag alloy (not illustrated) was greater than that of the In—Sn eutectic solder and had the highest ductility.

Another method for evaluating the reliability of connection is a high-speed shear test according to the Joint Electron Device Engineering Council standard JESD 22-B117A. In this evaluation test method, a mechanical shear stress is applied to a bonding material to measure the strength and ductility of the bonding material. Strength and ductility were measured by the evaluation test method.

Next, high-speed shear test specimens were prepared by reflowing the following bonding materials (5) to (8) disposed on a copper electrode having a diameter of 540 μm at a peak temperature of 150° C. The specimens after the reflow had a diameter of 600 μm.

(5) In-48Sn eutectic solder (6) In—Sn-1Ag alloy composed of the In-48Sn eutectic solder and 1% by weight Ag (7) In—Sn-3Ag alloy composed of the In-48Sn eutectic solder and 3% by weight Ag (8) In—Sn-5Ag alloy composed of the In-48Sn eutectic solder and 5% by weight Ag Table illustrated in FIG. 22 lists the In, $AgIn_2$, and $Ag_2In$ contents of the In—Sn-1Ag alloy, In—Sn-3Ag alloy, and In—Sn-5Ag alloy after the reflow. The In, $AgIn_2$, and $Ag_2In$ contents of the alloys were calculated from the area ratios and specific gravities of In, $AgIn_2$, and $Ag_2In$. The area ratios of In, $AgIn_2$, and $Ag_2In$ were measured on an elemental map prepared using an electron probe microanalyzer.

Figure 3:
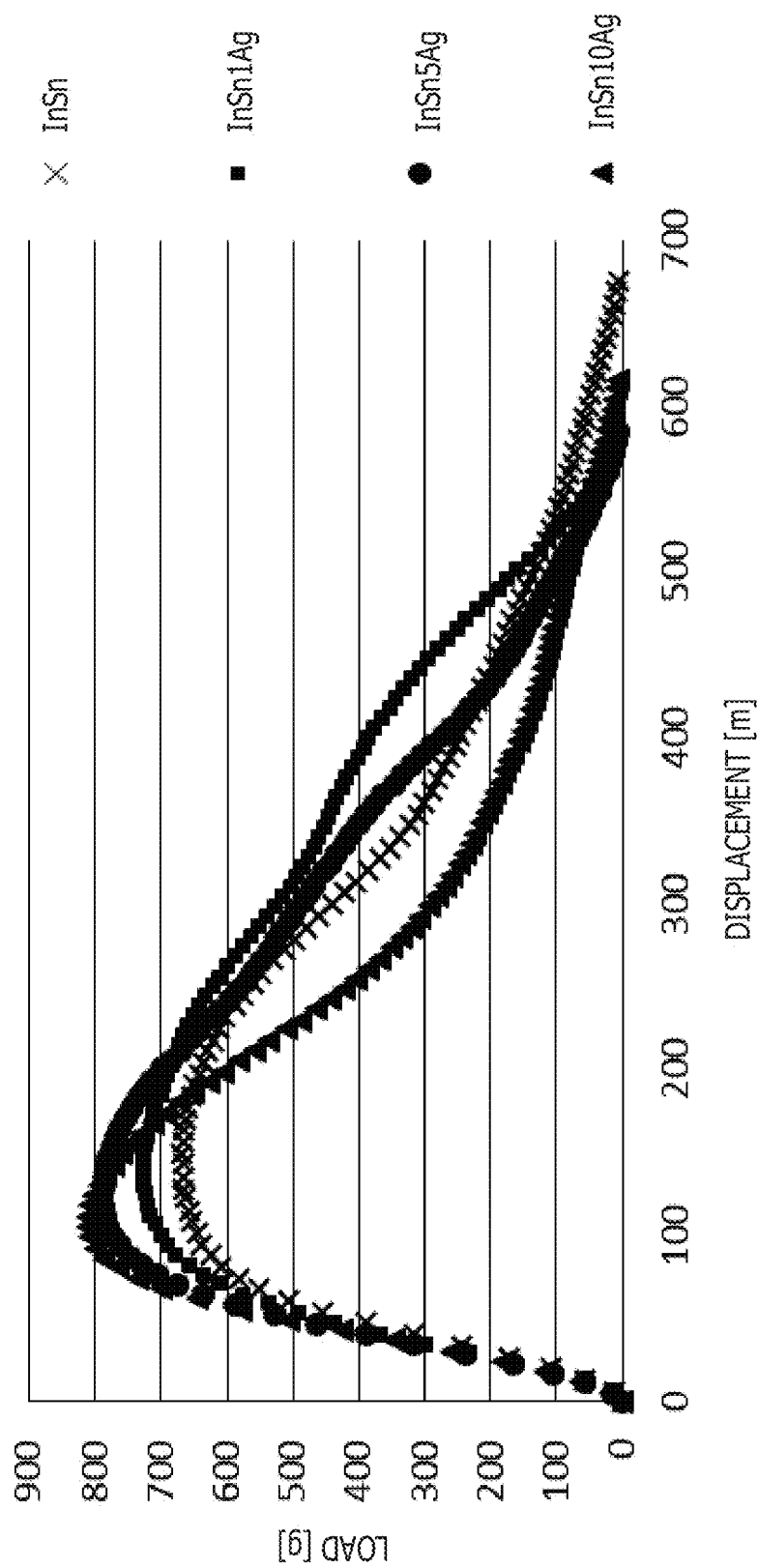
FIG. 3 is a graph of the high-speed shear strength test results for In—Sn—Ag alloys having Ag contents of 0%, 1%, 3%, and 5% by weight.

The specimens were subjected to a high-speed shear test with a Dage testing machine DAGE SIRIES 4000HS at a height of 100 μm from an electrode and at a shear speed of 3000 mm/s. FIG. 3 is a graph of the high-speed shear test results for the specimens. The high-speed shear test conformed to the standard JESD 22-B117A. In FIG. 3, the horizontal axis is the displacement of a bonding material, and the vertical axis is the load applied to the bonding material. In the graph of FIG. 3, the maximum value on the vertical axis is the strength of the bonding material. The displacement at the point in time when the load applied to the bonding material decreases to half the maximum load corresponds to the ductility of the bonding material. When the load applied to the bonding material decreases to half the maximum load, the bonding material is broken.

Table illustrated in FIG. 23 lists the strength and ductility of the In—Sn eutectic solder, In—Sn-1Ag alloy, In—Sn-3Ag alloy, and In—Sn-5Ag alloy after the reflow. It was found from Table 2 that the In—Sn-5Ag alloy had higher strength than the other bonding materials. However, the In—Sn-5Ag alloy had lower ductility than the other bonding materials. It was also found that the In—Sn-1Ag alloy and In—Sn-3Ag alloy had higher strength and ductility than the InSn eutectic solder free of Ag. Since the In—Sn-3Ag alloy had slightly higher ductility than the In—Sn eutectic solder, the addition of more than 3% by weight Ag to the In—Sn eutectic solder probably decrease the ductility of the In—Sn eutectic solder.

Figure 4A:
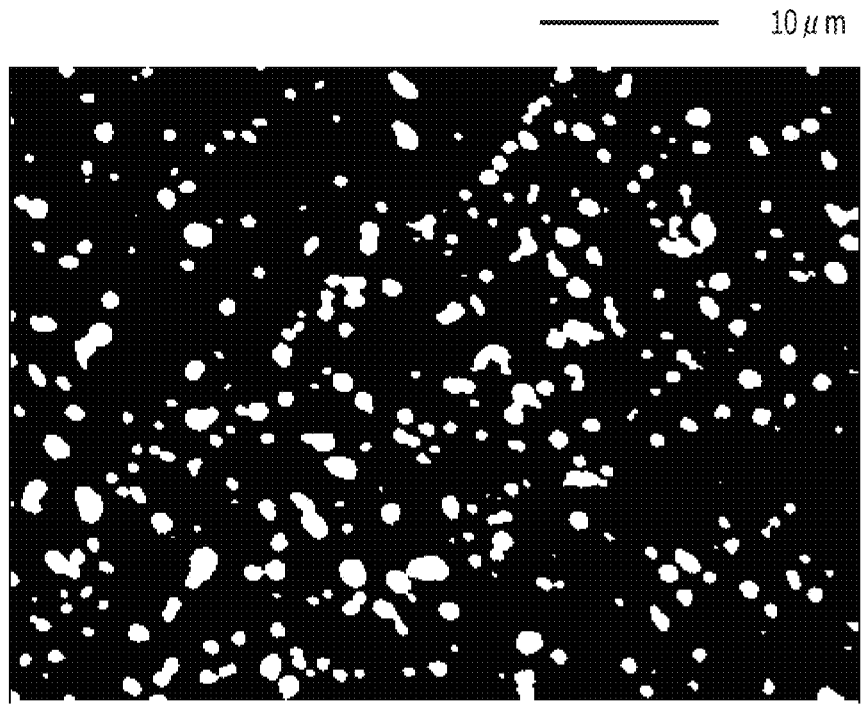
FIG. 4A is an elemental map of Ag in an In—Sn-1Ag alloy bonded to a Cu sheet.
Figure 4B:
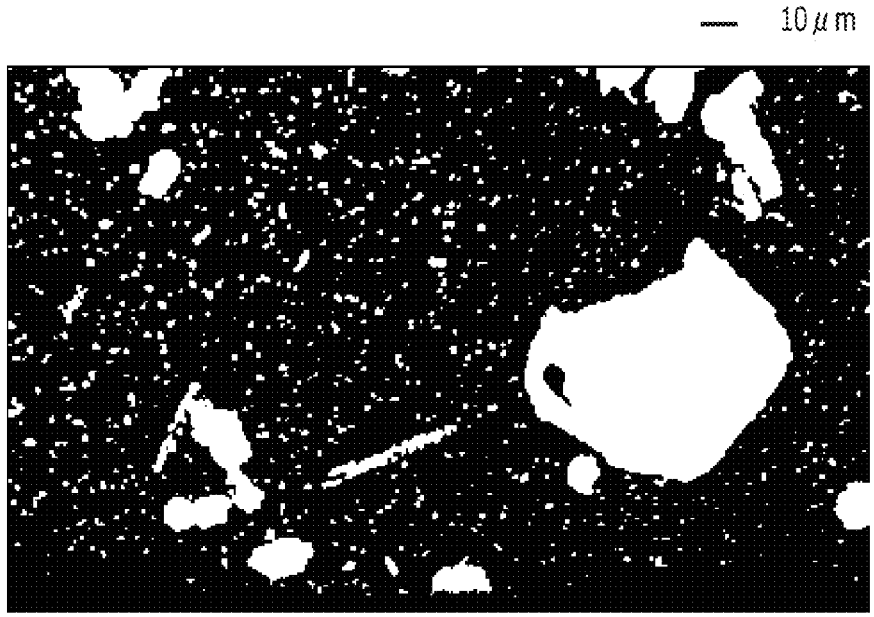
FIG. 4B is an elemental map of Ag in an In—Sn-5Ag alloy bonded to a Cu sheet.
Figure 4C:
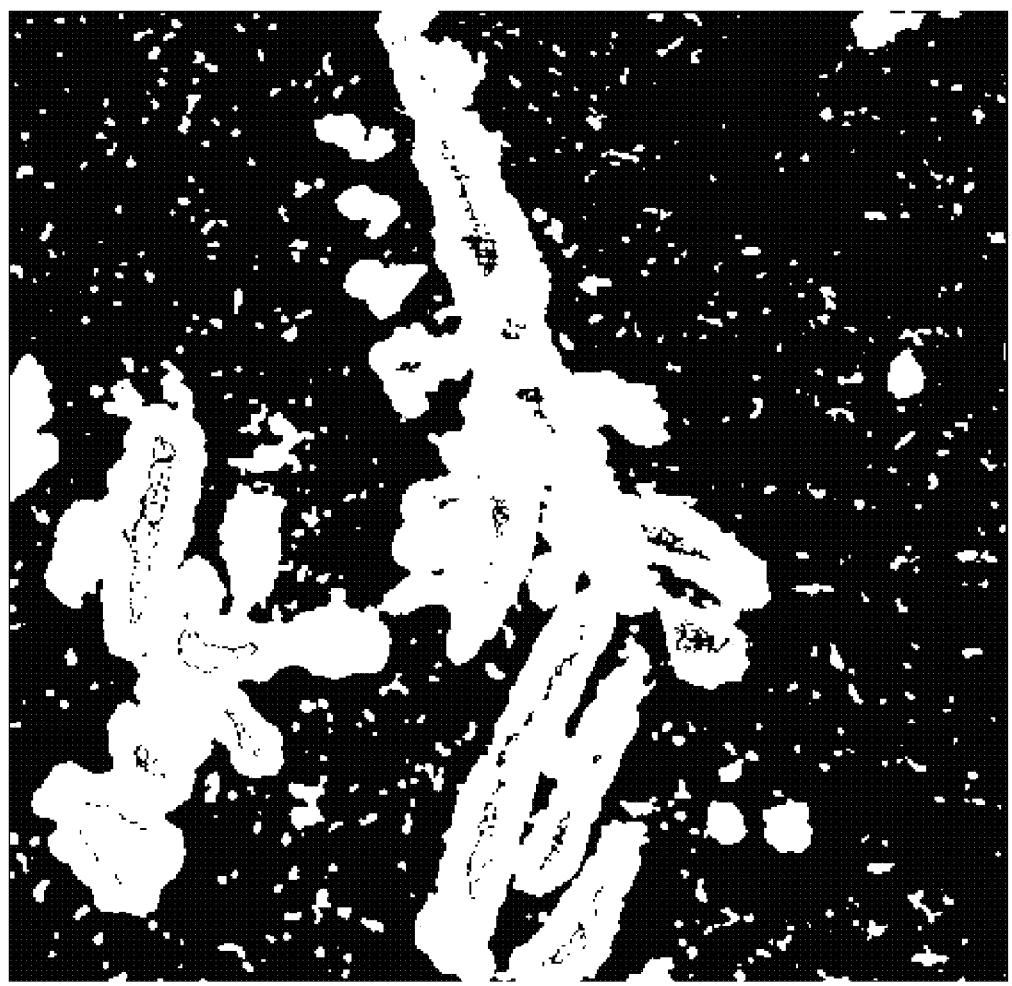
FIG. 4C is an elemental map of Ag in an In—Sn-10Ag alloy bonded to a Cu sheet.

An elemental map of each element of the In—Sn-1Ag alloy, In—Sn-5Ag alloy, and In—Sn-10Ag alloy bonded to a copper sheet was obtained using an electron probe microanalyzer. FIG. 4A is an elemental map of Ag in the In—Sn-1Ag alloy. FIG. 4B is an elemental map of Ag in the In—Sn-5Ag alloy. FIG. 4C is an elemental map of Ag in the In—Sn-10Ag alloy. In the In—Sn-10Ag alloy, the $AgIn_2$ content ranges from 2% to 3% by weight, the $Ag_2In$ content ranges from 10% to 13% by weight, and the In content is 47% by weight.

It was found from the elemental map of each element of the In—Sn-1Ag alloy that white dots representing Ag in FIG. 4A corresponded approximately to the intermetallic compound $AgIn_2$. Each dot has a size of approximately 1 μm. $AgIn_2$ is generally finely distributed in the In—Sn-1Ag alloy. The $AgIn_2$ content of the In—Sn-1Ag alloy ranges from 2% to 4% by weight. $Ag_2In$ constituted approximately 0.0001% by weight and was not clearly identified in the elemental map of each element.

It was found from an elemental map of the In—Sn-1Ag alloy that the In—Sn-1Ag alloy contained finely dispersed $AgIn_2$. Based on the tensile test results in FIG. 2, the In—Sn-1Ag alloy had higher ductility than the InSn eutectic solder. It is supposed from the measurement results that $AgIn_2$ contributes to the ductility of the In—Sn—Ag alloy.

It was found that although the In—Sn-1Ag alloy had slightly lower strength than the InSn eutectic solder based on the tensile test results in FIG. 2, the In—Sn-1Ag alloy had higher strength than the InSn eutectic solder based on the high-speed shear test results in FIG. 3. Although the strength of a bonding material itself is measured as a function of the tensile strain of the bonding material in the tensile test, the shear strength of the bonding material bonded to a copper sheet is measured in the high-speed shear test. It is assumed that the In—Sn—Ag alloy in the high-speed shear test formed an intermetallic compound layer with copper of the copper sheet and thereby had high strength. The high-speed shear test results indicate the strength of a bonding material bonded to an electrical component and indicate that a bonding portion between the In—Sn-1Ag alloy and an electrical component has high strength and ductility. Cu is not the only metal that can form an intermetallic compound layer at an interface between the metal and an In—Sn—Ag alloy bonding material and thereby have high strength. In—Sn—Ag alloys can also form an intermetallic compound layer at an interface between the In—Sn—Ag alloys and a metal used as an electrode material, such as Ni or Au, and thereby have high strength. Even having low strength in a tensile test, bonding materials having high strength in a high-speed shear test have few practical difficulties in electrical apparatuses.

In FIGS. 4B and 4C, white regions having sizes in the range of approximately 10 μm to 50 μm represent the intermetallic compound $Ag_2In$, and white regions having sizes of approximately 1 μm represent the intermetallic compound $AgIn_2$. Unlike $AgIn_2$ finely dispersed in In—Sn—Ag alloys, $Ag_2In$ in In—Sn—Ag alloys is grown. In FIGS. 4B and 4C, because grown $Ag_2In$ occupies a larger area than $AgIn_2$, the $Ag_2In$ content of each of the In—Sn-5Ag alloy and the In—Sn-10Ag alloy is higher than the corresponding $AgIn_2$ content. In Table 1, the $AgIn_2$ content of the In—Sn-5Ag alloy ranges from 2% to 3% by weight, and the $Ag_2In$ content ranges from 3.5% to 4.5% by weight.

It was found from an elemental map of the In—Sn-10Ag alloy that the In—Sn-10Ag alloy contained finely dispersed $AgIn_2$ and grown $Ag_2In$. Based on the tensile test results in FIG. 2, the In—Sn-10Ag alloy had higher strength but much lower ductility than the InSn eutectic solder.

Comparing FIG. 4A with FIG. 4C, although both the In—Sn-1Ag alloy and the In—Sn-10Ag alloy contain $AgIn_2$, the In—Sn-10Ag alloy differs from the In—Sn-1Ag alloy in that the In—Sn-10Ag alloy contains grown $Ag_2In$. Thus, it is supposed that the In—Sn-10Ag alloy has high strength but low ductility due to the grown $Ag_2In$.

The In—Sn-1Ag alloy and In—Sn-3Ag alloy are In—Sn—Ag alloys having a lower $Ag_2In$ content than the $AgIn_2$ content. A higher $Ag_2In$ content than the $AgIn_2$ content of the In—Sn—Ag alloys results in very low ductility of the bonding portion 31 and poor reliability of the mechanical and electrical connection of the electrical apparatus 1.

At a higher grown $Ag_2In$ content than the $AgIn_2$ content, because of greater $Ag_2In$ grains than $AgIn_2$ grains, deformation of the In—Sn—Ag alloys tends to cause stress concentration at $Ag_2In$ grain boundaries and cause the In—Sn—Ag alloys to be broken. Thus, In—Sn—Ag alloys containing grown $Ag_2In$ tend to have low ductility. On the other hand, strength increases to such an extent as to impede deformation. Because of low melting points of In—Sn alloys, greater intermetallic compound grains, such as grown $Ag_2In$, are more likely to impede deformation. Thus, In—Sn—Ag alloys containing grown $Ag_2In$ have high strength.

When the bonding portion 31 is composed of an In—Sn—Ag alloy containing $AgIn_2$ and no $Ag_2In$, the bonding portion 31 has low strength, and the electrical apparatus 1 has insufficient reliability of connection.

In In—Sn—Ag alloys containing finely dispersed $AgIn_2$ and no $Ag_2In$, the finely dispersed $AgIn_2$ grains can relieve stress due to being finely dispersed and can suppress breakage. Thus, In—Sn—Ag alloys containing finely dispersed $AgIn_2$ have high ductility. On the other hand, small grains, such as finely dispersed $AgIn_2$, have short grain boundaries. Short grain boundaries tend to cause deformation due to grain boundary sliding. Although deformation due to grain boundary sliding generally occurs at high temperatures, because In—Sn alloys have low melting points, deformation due to grain boundary sliding occurs. Thus, In—Sn—Ag alloys containing finely dispersed $AgIn_2$ have low strength.

Although the electrical apparatus 1 according to the first embodiment includes the barrier metal films, the barrier metal films may be omitted. The bonding portion may be directly disposed on the Cu electrodes without the barrier metal films. Although the semiconductor device is mounted on the circuit board in the present embodiment, other embodiments are also possible. For example, in other embodiments, the bonding portion of the present embodiment may be applied to a bonding portion of various electrical components, such as a semiconductor device and an interposer, or an interposer and a circuit board.

(Method for Manufacturing Electrical Apparatus According to First Embodiment)

A method for manufacturing the electrical apparatus according to the first embodiment will be described below with reference to FIGS. 5 to 10. FIGS. 5 to 10 illustrate a process of manufacturing the electrical apparatus according to the first embodiment.

Figure 5:
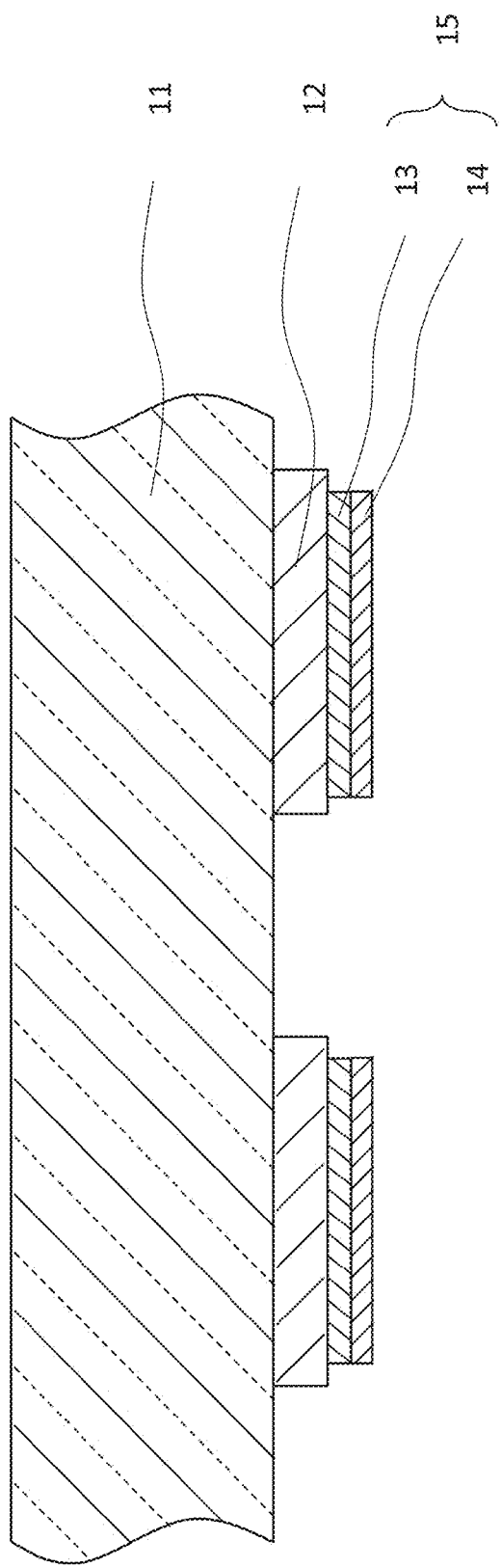
FIG. 5 is a cross-sectional view (1) of a process of manufacturing the electrical apparatus according to the first embodiment.

As illustrated in FIG. 5, for example, the Cu electrode 12 composed mainly of Cu is formed on a surface of the semiconductor device 11 by an electroless plating method. The barrier metal film 15 is formed on the Cu electrode 12. For example, the barrier metal film 15 is composed of the Ni film 13 and the Au film 14. The Ni film 13 is formed by the electroless plating method and has a thickness of approximately 5 μm. The Au film 14 is formed on the Ni film 13 by the electroless plating method and has a thickness in the range of approximately 0.1 μm to 0.3 μm. The barrier metal film 15 can suppress the diffusion of the connection medium 32 into the Cu electrode 12 and thereby improve the reliability of connection of the bonding portion 31.

Figure 6A:
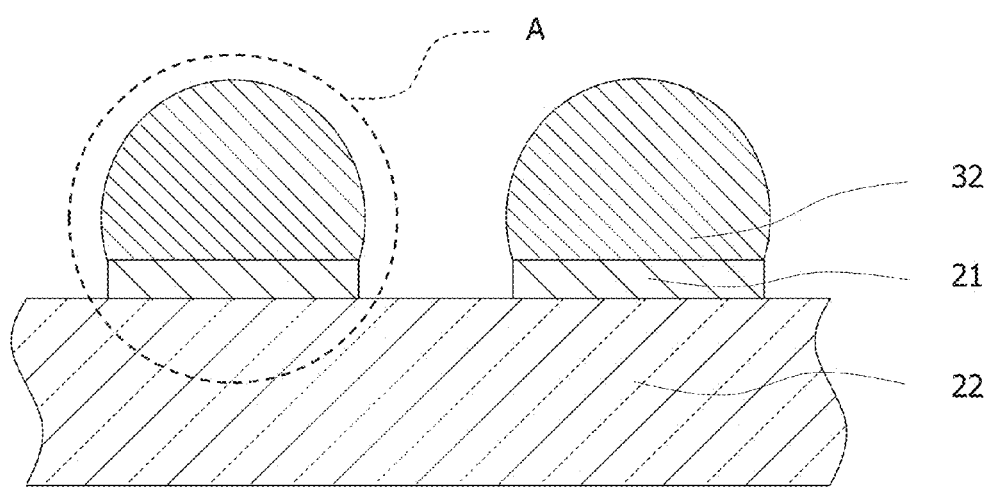
FIG. 6A is a cross-sectional view (2) of the process of manufacturing the electrical apparatus according to the first embodiment.
Figure 6B:
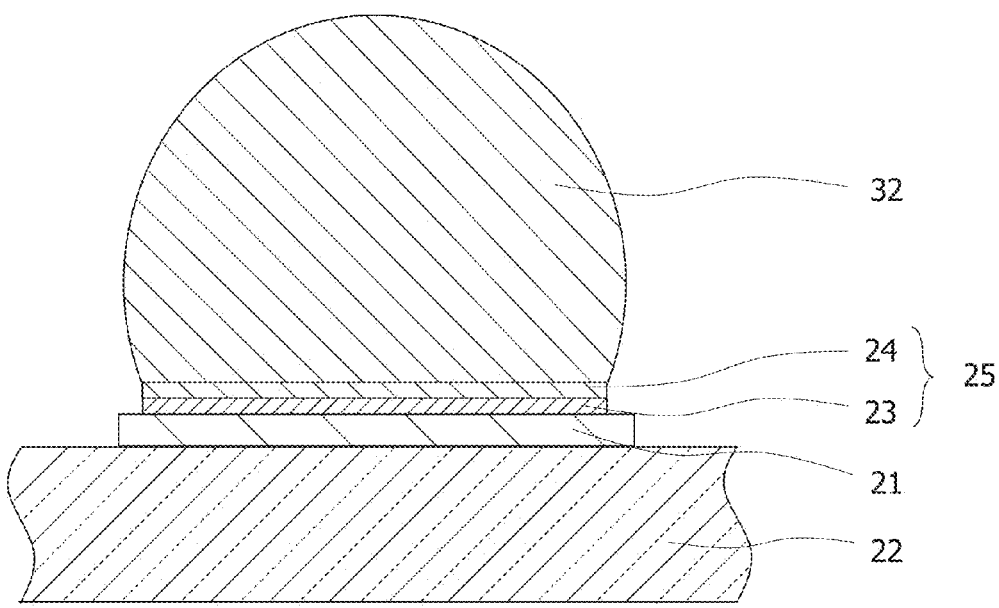
FIG. 6B is an enlarged view of a portion surrounded by the dotted line A in FIG. 6A.

As illustrated in FIG. 6A, the Cu electrode 21 composed mainly of Cu is formed on a surface of the circuit board 22 by the electroless plating method. FIG. 6B is an enlarged view of a portion surrounded by the dotted line A in FIG. 6A. The barrier metal film 25 is formed on the Cu electrode 21 composed mainly of Cu on the surface of the circuit board 22. For example, the barrier metal film 25 is composed of the Ni film 23 and the Au film 24. The Ni film 23 is formed by the electroless plating method and has a thickness of approximately 5 μm. The Au film 24 is formed on the Ni film 23 by the electroless plating method and has a thickness in the range of approximately 0.1 to 0.3 μm. The barrier metal film 25 can suppress the diffusion of the connection medium 32 into the Cu electrode 21 and thereby improve the reliability of connection of the bonding portion 31.

After the barrier metal film 25 is formed, the connection medium 32 composed of an In—Sn—Ag alloy and having a thickness in the range of approximately 10 μm to 15 μm is deposited on the barrier metal film 25. The connection medium 32 composed of the In—Sn—Ag alloy preferably contains not less than 43% and not more than 60% by weight In and not less than 1% and not more than 3% by weight Ag. When the connection medium 32 composed of the In—Sn—Ag alloy contains not less than 43% and not more than 60% by weight In and not less than 1% and not more than 3% by weight Ag, the connection medium 32 after reflow can contain more $AgIn_2$ than $Ag_2In$, and the bonding portion 31 of the electrical apparatus 1 in FIG. 1A has high strength and ductility. In the method for manufacturing the electrical apparatus according to the first embodiment described below, the barrier metal film 15 and the barrier metal film 25 are omitted in the figures for the sake of simplicity.

Figure 7:
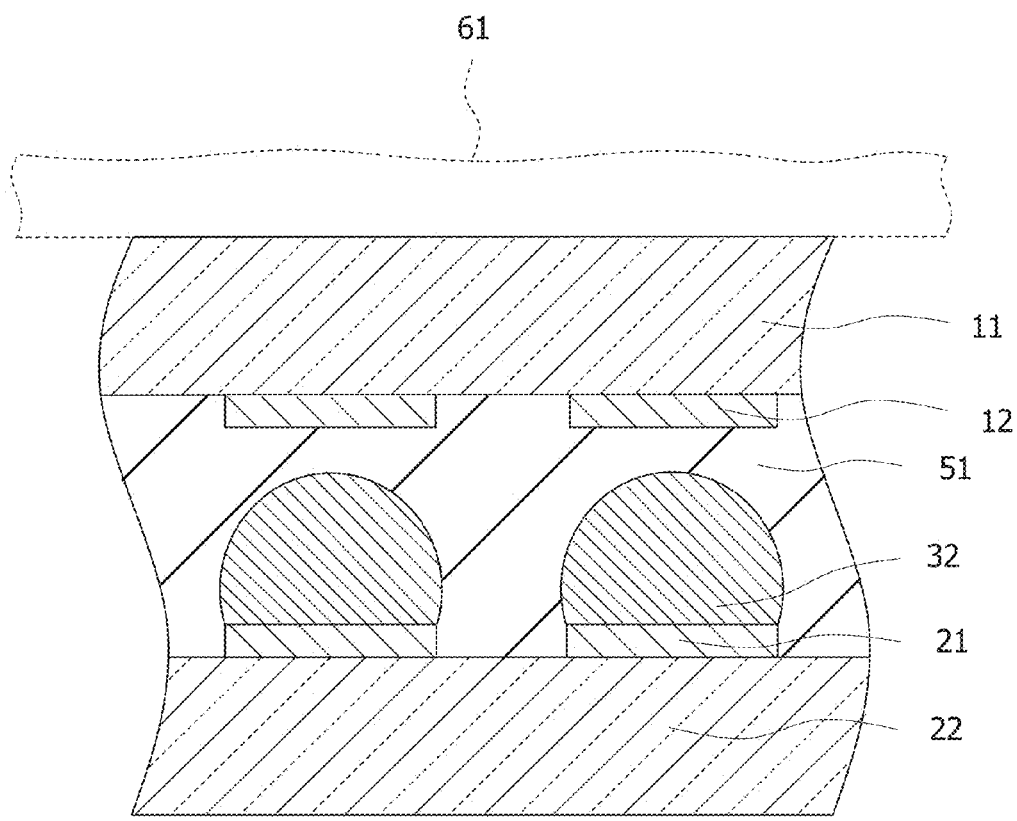
FIG. 7 is a cross-sectional view (3) of the process of manufacturing the electrical apparatus according to the first embodiment.

As illustrated in FIG. 7, a flux 51 is applied to the circuit board 22. The semiconductor device 11 illustrated in FIG. 5 is prepared. While the semiconductor device 11 is held with a flip chip bonder 61, the electrode 12 of the semiconductor device 11 and the electrode 21 of the circuit board 22 are properly positioned.

Figure 8:
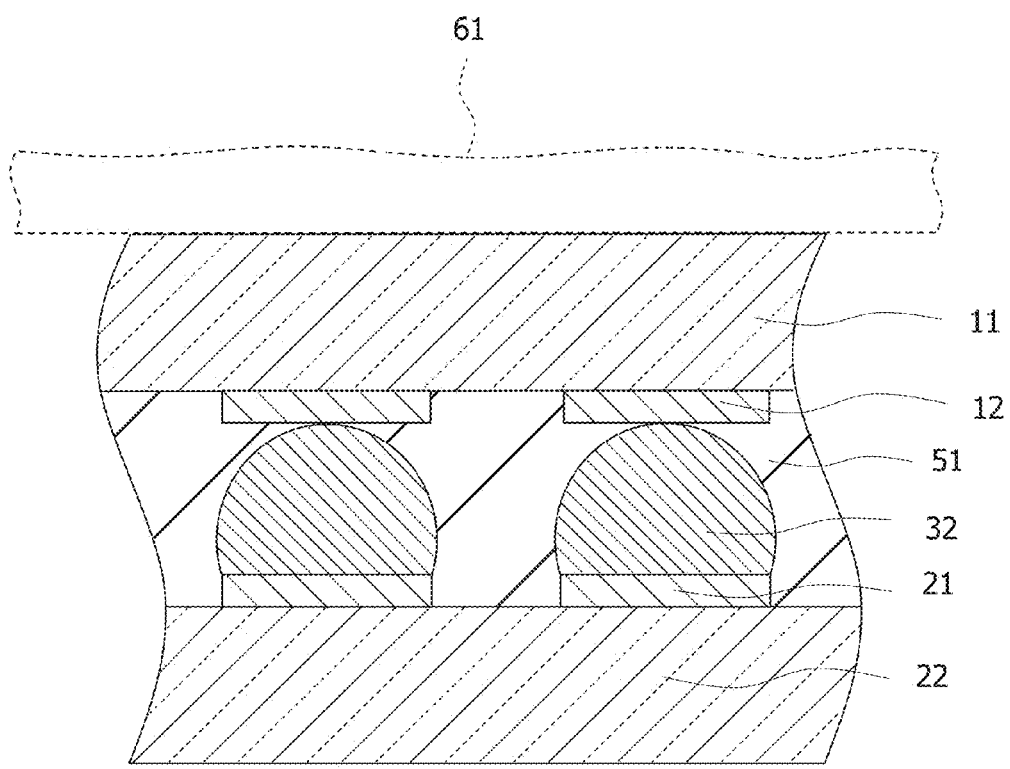
FIG. 8 is a cross-sectional view (4) of the process of manufacturing the electrical apparatus according to the first embodiment.

As illustrated in FIG. 8, the semiconductor device 11 held with the flip chip bonder 61 is then temporarily attached to the circuit board 22 utilizing the tackiness of the flux 51. The term tackiness, as used herein, refers to a property of holding a positional relationship between components to be bonded utilizing stickiness.

Figure 9:
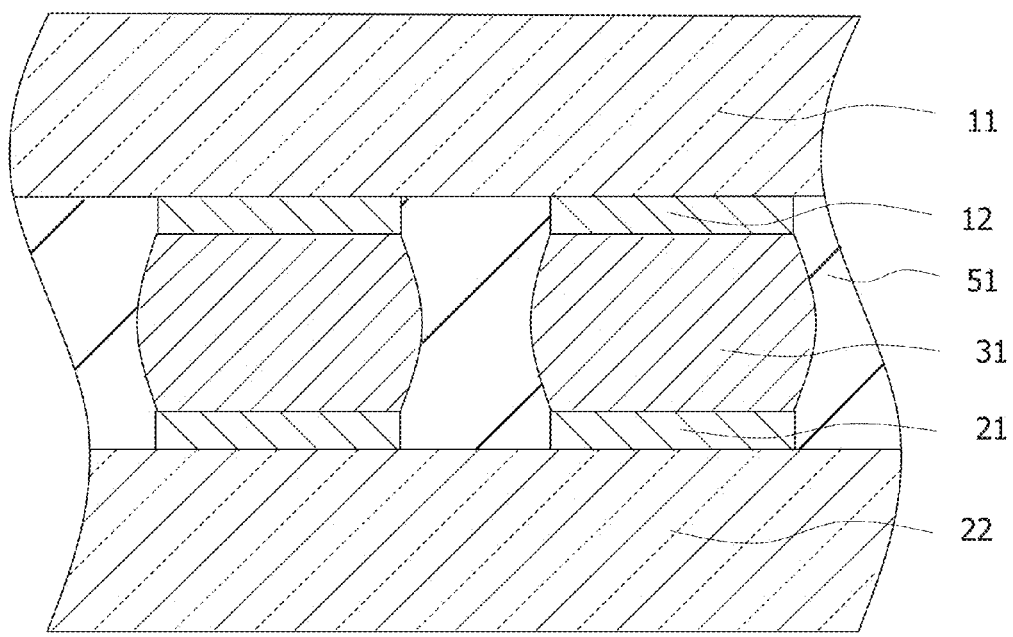
FIG. 9 is a cross-sectional view (5) of the process of manufacturing the electrical apparatus according to the first embodiment.
Figure 10:
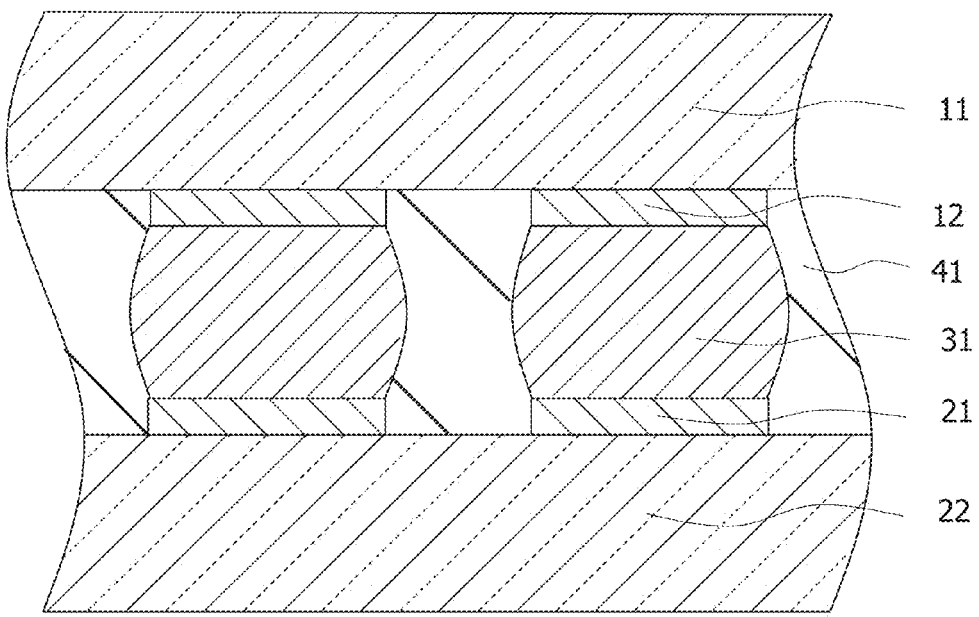
FIG. 10 is a cross-sectional view (6) of the process of manufacturing the electrical apparatus according to the first embodiment.

As illustrated in FIG. 9, the connection medium 32 composed of an In—Sn—Ag alloy containing not less than 43% and not more than 60% by weight In and not more than 3% by weight Ag is then heated to a temperature not less than the melting point of the connection medium 32, that is, 113° C. or more. However, an excessively high temperature results in increased warping of an electrical component and lower reliability of connection. Thus, the connection medium 32 is preferably heated to and melted at a temperature in the range of, for example, 115° C. to 150° C., thereby bonding the semiconductor device 11 to the circuit board 22.

During cooling at a temperature above the solidus temperature of the In—Sn—Ag alloy as described above, $Ag_2In$ is crystallized from the In—Sn—Ag alloy in the molten state. While the crystallized $Ag_2In$ migrates in the molten In—Sn—Ag alloy, the crystallized $Ag_2In$ combines with another crystallized $Ag_2In$ and grows. Grown $Ag_2In$ is responsible for low ductility. During cooling at a temperature below the solidus temperature of the In—Sn—Ag alloy, the intermetallic compound $AgIn_2$ is precipitated from the In—Sn—Ag alloy in the solid state. Precipitated $AgIn_2$ does not migrate in the solid In—Sn—Ag alloy and retains the finely dispersed state. It is found from the elemental map of the In—Sn-1Ag alloy in FIG. 4A and the high-speed shear test results in FIG. 3 that the In—Sn—Ag alloy containing finely dispersed $AgIn_2$ has high strength and ductility.

Figure 11:
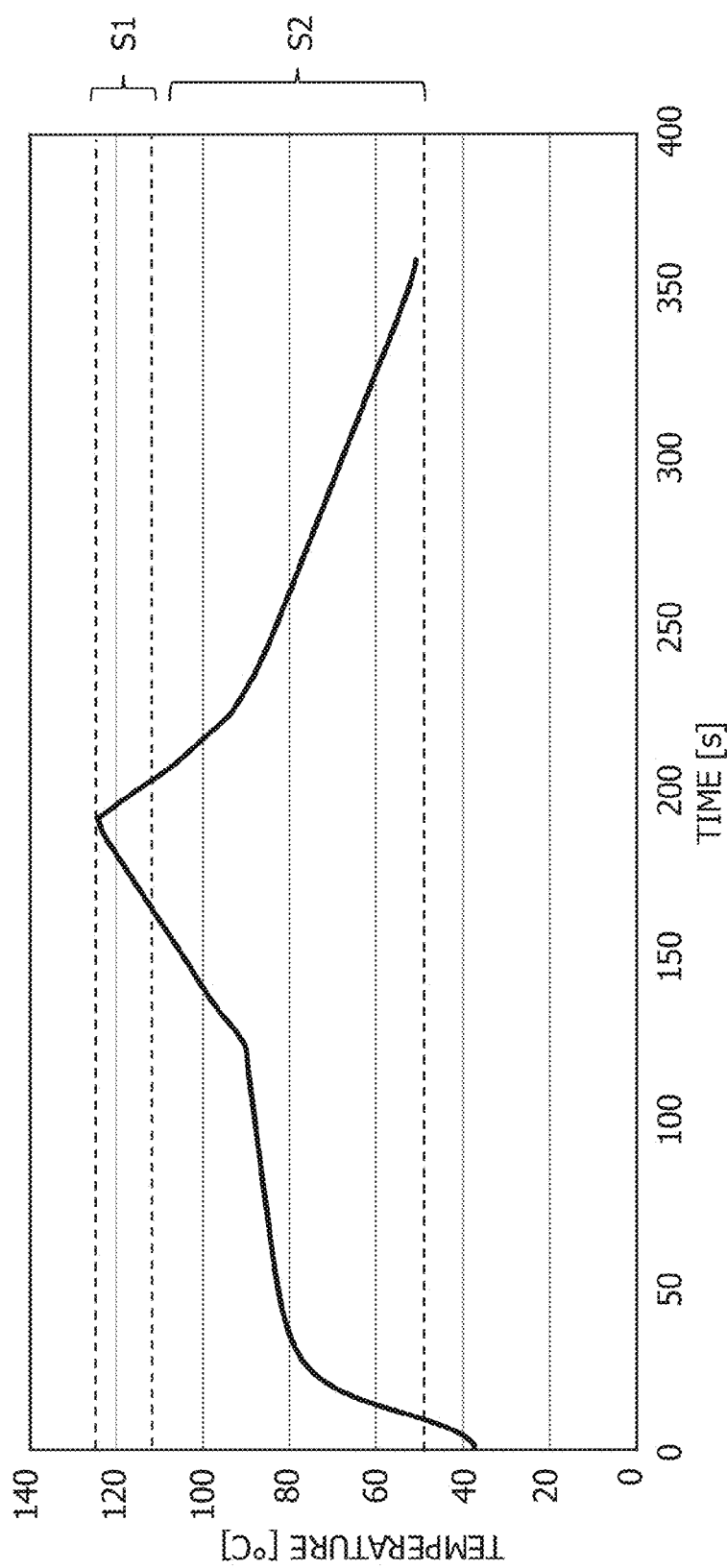
FIG. 11 is a graph of temperature changes in a heater in a step of reflow heating of an In—Sn-1Ag alloy on a Cu sheet and in a cooling step after the reflow heating step.

FIG. 11 is a temperature profile for reflow of the In—Sn-1Ag alloy on a Cu sheet using a reflowing apparatus. FIG. 4A is an elemental map of a cross section of a specimen prepared by reflow following the temperature profile illustrated in FIG. 11.

In FIG. 11, the horizontal axis is the time (seconds), and the vertical axis is the temperature (° C.). The In—Sn-1Ag alloy has a solidus temperature of approximately 113° C. In FIG. 11, S1 denotes a temperature range above the solidus temperature, and S2 denotes a temperature range below the solidus temperature. In FIG. 11, the In—Sn-1Ag alloy in the temperature range S1 is in the molten state, and the In—Sn-1Ag alloy in the temperature range S2 is in the solid state.

$AgIn_2$ is precipitated in S2. In a cooling step in the temperature range S2, when the internal temperature of the reflowing apparatus is less than approximately 50° C., $AgIn_2$ is not sufficiently precipitated. Thus, the cooling control of the reflowing apparatus is down to approximately 50° C. When the internal temperature of the reflowing apparatus is in the temperature range S2 and is more than 50° C., the In—Sn-1Ag alloy on the Cu sheet taken out of the reflowing apparatus is rapidly cooled, and precipitation of $AgIn_2$ may be decreased.

Approximately 190 seconds after the start of a reflow heating step, the internal temperature of the reflowing apparatus reaches approximately 122° C. in the temperature range S1, and the In—Sn-1Ag alloy is in the molten state. After the In—Sn-1Ag alloy is heated and melted, heating of the reflowing apparatus is stopped, or the heating temperature is decreased. The internal temperature of the reflowing apparatus is decreased to a temperature in the temperature range S2, thereby cooling and solidifying the In—Sn-1Ag alloy. After the internal temperature of the reflowing apparatus reaches approximately 50° C., the In—Sn-1Ag alloy on the Cu sheet is taken out of the reflowing apparatus and is naturally cooled.

As illustrated in FIG. 11, the average cooling rate of the In—Sn-1Ag alloy in the cooling step in the temperature range S1 is higher than the average cooling rate of the In—Sn-1Ag alloy in the cooling step in the temperature range S2. The cooling rate in the reflowing apparatus in the cooling step can be controlled such that the $AgIn_2$ content of the In—Sn-1Ag alloy is higher than the $Ag_2In$ content of the In—Sn-1Ag alloy. The average cooling rate of the In—Sn-1Ag alloy in the cooling step in the temperature range S1 is preferably not less than 1.0° C./s in order to decrease the $Ag_2In$ content of the In—Sn-1Ag alloy. The average cooling rate of the In—Sn-1Ag alloy in the cooling step in the temperature range S2 is preferably 0.4° C./s, which is lower than the average cooling rate in the temperature range S1 (1.0° C./s), in order to increase the $AgIn_2$ content of the In—Sn-1Ag alloy.

Based on the experimental findings obtained from the temperature profile of the In—Sn-1Ag alloy on the Cu sheet illustrated in FIG. 11, the average cooling rate in the cooling step above the solidus temperature of the connection medium 32 is higher than the average cooling rate in the cooling step below the solidus temperature of the connection medium 32. Cooling under such cooling conditions results in the $AgIn_2$ content higher than the $Ag_2In$ content of the bonding portion 31 of the electrical apparatus 1 illustrated in FIG. 1A and high strength and ductility of the bonding portion 31.

After the step illustrated in FIG. 9, the residue of the flux 51 is removed. For example, the residue of the flux 51 can be removed by immersing the structure illustrated in FIG. 9 in a mixed organic solvent of xylene and isopropyl alcohol at approximately 70° C. for 1 hour. The structure illustrated in FIG. 9 from which the residue of the flux 51 has been removed is then dried, for example, at 120° C. for 2 hours and is filled with the underfill 41, thus completing the electrical apparatus 1 illustrated in FIG. 10. The underfill 41 between the semiconductor device 11 and the circuit board 22 increases the bonding strength therebetween and improves the reliability of connection of the electrical apparatus 1. The foregoing is the method for manufacturing the electrical apparatus according to the first embodiment.

As described above, in the electrical apparatus 1 according to the first embodiment, a bonding portion between electrical components is composed of an In—Sn—Ag alloy having a melting point of approximately 113° C. and having a lower $Ag_2In$ content than the $AgIn_2$ content. The electrical components can therefore be bonded together by reflow at low temperatures. This decreases warping of the electrical components, and the bonding portion has high ductility and strength even under impacts or stress. Thus, the bonding portion has no defects, such as cracks, and the electrical apparatus has high reliability of connection.

(Second Embodiment) The present embodiment relates to an electrical apparatus in which electrical components are mounted in stages.

Figure 12A:
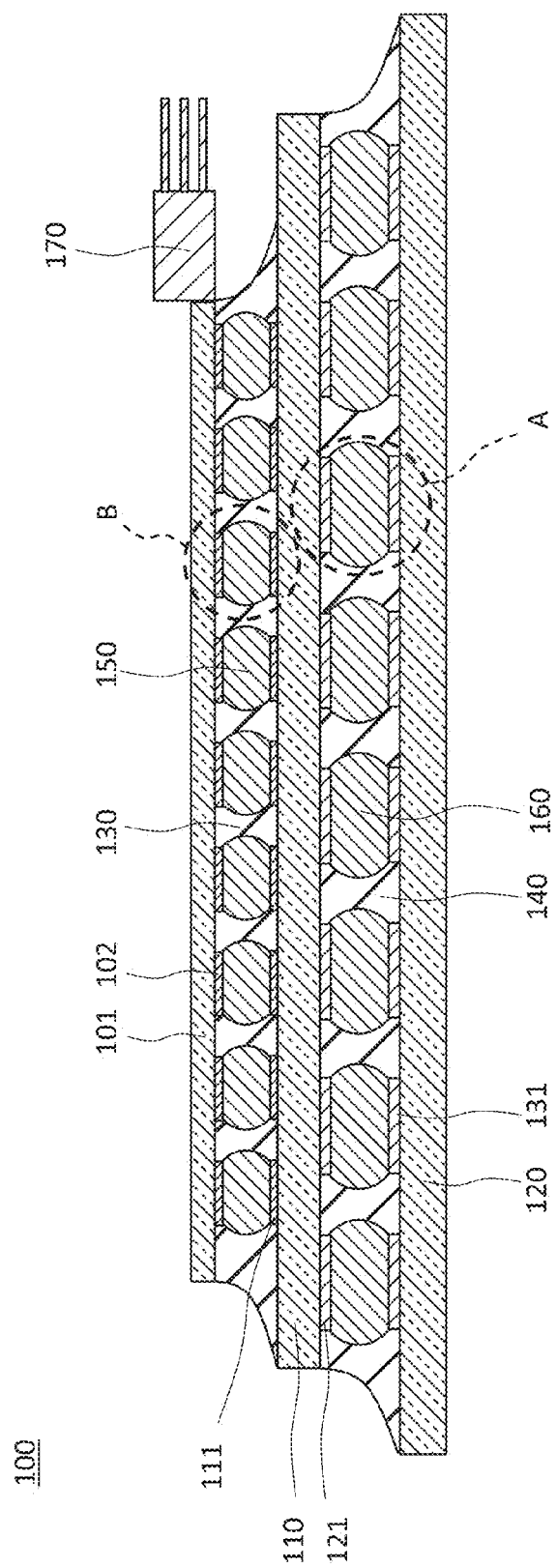
FIG. 12A is a cross-sectional view of an electrical apparatus according to a second embodiment.

The structure of an electrical apparatus according to a second embodiment will be described below. FIG. 12A is a cross-sectional view of the electrical apparatus according to the second embodiment.

Referring to FIG. 12A, an electrical apparatus 100 includes a semiconductor device 101, electrodes 102 on the semiconductor device 101, an interposer 110, electrodes 111 and electrodes 121 on the interposer 110, a circuit board 120, electrodes 131 on the circuit board 120, first bonding portions 150, second bonding portions 160, an underfill 130, and an underfill 140. In the electrical apparatus 100, the semiconductor device 101 is electrically connected to the interposer 110 via the first bonding portions 150. The space between the semiconductor device 101 and the interposer 110 is filled with the underfill 130. The interposer 110 is electrically connected to the circuit board 120 via the second bonding portions 160. The space between the interposer 110 and the circuit board 120 is filled with the underfill 140. An optical component 170 is coupled to the semiconductor device 101. The structure of the electrical apparatus 100 will be described below in detail.

Figure 12B:
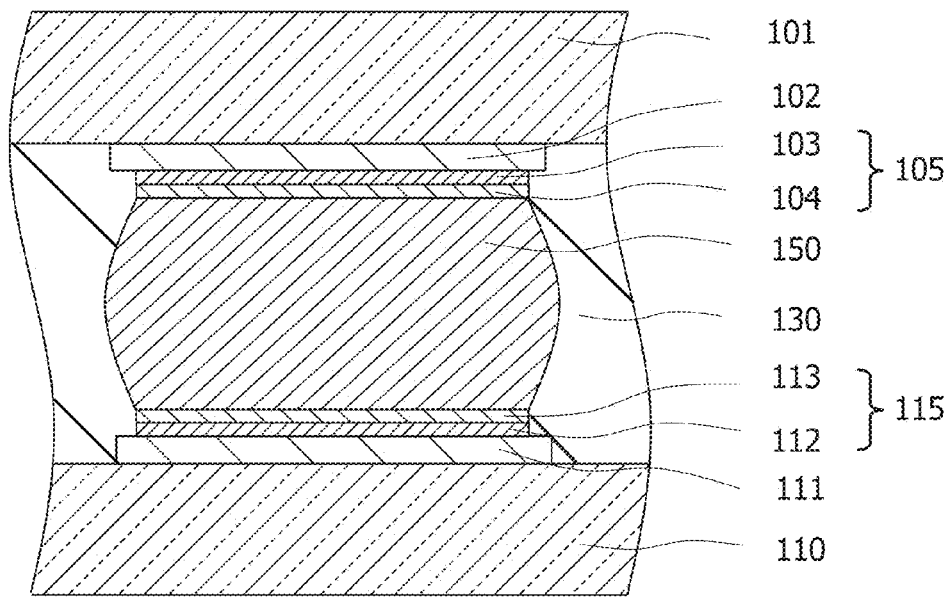
FIG. 12B is an enlarged view of a portion surrounded by the dotted line A in FIG. 12A.
Figure 12C:
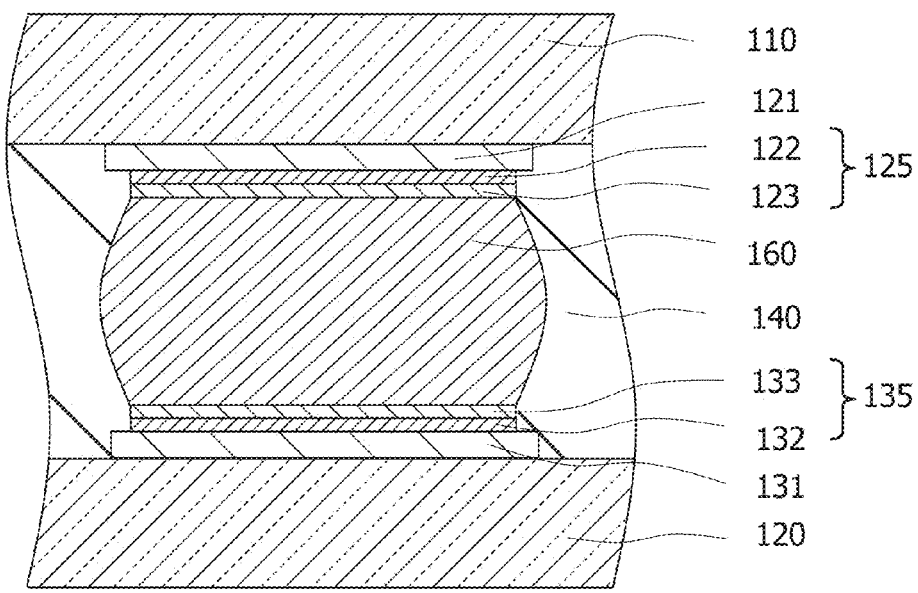
FIG. 12C is an enlarged view of a portion surrounded by the dotted line B in FIG. 12A.

FIG. 12B is an enlarged view of a portion surrounded by the dotted line A in FIG. 12A. FIG. 12C is an enlarged view of a portion surrounded by the dotted line B in FIG. 12A. First, the enlarged view of a portion surrounded by the dotted line A will be described below. A barrier metal film 105 is disposed on each of the electrodes 102 made of Cu, which is disposed on a surface of the semiconductor device 101. The barrier metal film 105 includes a Ni film 103 and a Au film 104 on the Cu electrode 102 in this order. A barrier metal film 115 is disposed on each of the electrodes 111 made of Cu, which is disposed on a surface of the interposer 110. The barrier metal film 115 includes a Ni film 112 and a Au film 113 on the Cu electrode 111 in this order.

The enlarged view of a portion surrounded by the dotted line B will be described below. A barrier metal film 125 is disposed on each of the electrodes 121 made of Cu, which is disposed on a surface of the interposer 110. The barrier metal film 125 includes a Ni film 122 and a Au film 123 on the Cu electrode 121 in this order. A barrier metal film 135 is disposed on each of the electrodes 131 made of Cu, which is disposed on a surface of the circuit board 120. The barrier metal film 135 includes a Ni film 132 and a Au film 133 on the Cu electrode 131 in this order.

The barrier metal film 105 and the barrier metal film 115 on the Cu electrode 102 and the Cu electrode 111 can suppress the diffusion of a connection medium 151 into the Cu electrode 102 and the Cu electrode 111 and thereby improve the reliability of connection of the first bonding portions 150.

The barrier metal film 125 and the barrier metal film 135 on the Cu electrode 121 and the Cu electrode 131 can suppress the diffusion of a connection medium 161 into the Cu electrode 121 and the Cu electrode 131 and thereby improve the reliability of connection of the second bonding portions 160.

The semiconductor device 101 is electrically connected to the interposer 110 via the first bonding portions 150. For example, the first bonding portions 150 is composed of a Sn-58Bi alloy having a melting point of 138° C., a Sn-0.7Cu alloy having a melting point of 227° C., a Sn-3Ag-0.5Cu alloy having a melting point of 217° C., or a Sn-3.5Ag alloy having a melting point of 221° C.

The circuit board 120 is electrically connected to the interposer 110 via the second bonding portions 160. The second bonding portions 160 have a melting point of approximately 113° C. and are composed of an In—Sn—Ag alloy having a lower $Ag_2In$ content than the $AgIn_2$ content.

Since the second bonding portions 160 of the electrical apparatus 100 according to the second embodiment are composed of the In—Sn—Ag alloy having a lower $Ag_2In$ content than the $AgIn_2$ content, the electrical apparatus 100 has high strength and ductility. Although the optical component 170 is highly susceptible to heat, the second bonding portions 160 composed of the In—Sn—Ag alloy having a lower $Ag_2In$ content than the $AgIn_2$ content allow mounting at low temperatures, thus improving the reliability of connection of the optical component 170.

Although the electrical apparatus 100 according to the second embodiment includes the barrier metal films, the barrier metal films may be omitted. The bonding portions may be directly disposed on the Cu electrodes without the barrier metal films. Although the semiconductor device and interposer are mounted in stages on the circuit board in the present embodiment, other embodiments are also possible. The embodiments discussed herein may be applied to various electrical components. For example, electrical components bonded with a bonding material for primary mounting may be a semiconductor device and a package substrate, and electrical components bonded with a bonding material for secondary mounting may be a package substrate and a circuit board.

(Method for Manufacturing Electrical Apparatus According to Second Embodiment)

A method for manufacturing the electrical apparatus according to the second embodiment will be described below with reference to FIGS. 13 to 21. FIGS. 13 to 21 illustrate a process of manufacturing the electrical apparatus according to the second embodiment.

Figure 13:
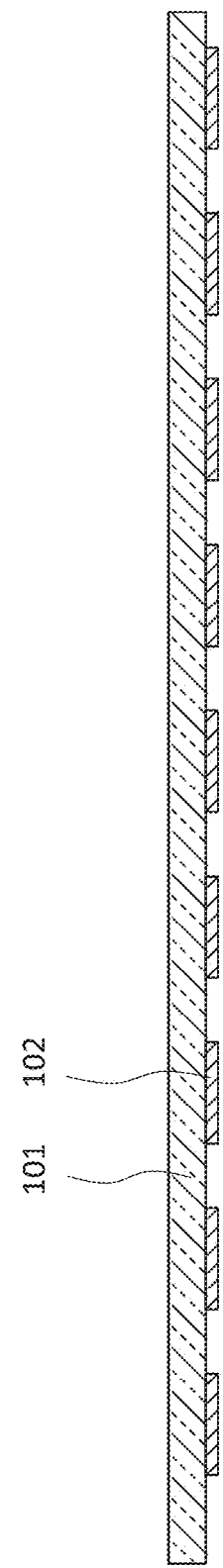
FIG. 13 is a cross-sectional view (1) of a process of manufacturing the electrical apparatus according to the second embodiment.

As illustrated in FIG. 13, for example, the Cu electrodes 102 composed mainly of Cu are formed on a surface of the semiconductor device 101 by an electroless plating method. As in the Cu electrode 12 on the semiconductor device 11 in the first embodiment, a barrier metal film may be formed. The barrier metal film 105 on the Cu electrode 102 can suppress the diffusion of the connection medium 151 into the Cu electrode 102 and improve the reliability of connection of the first bonding portions 150. In the method for manufacturing the electrical apparatus according to the second embodiment described below, the barrier metal film on the Cu electrode 102 is omitted in the figures for the sake of simplicity.

Figure 14:
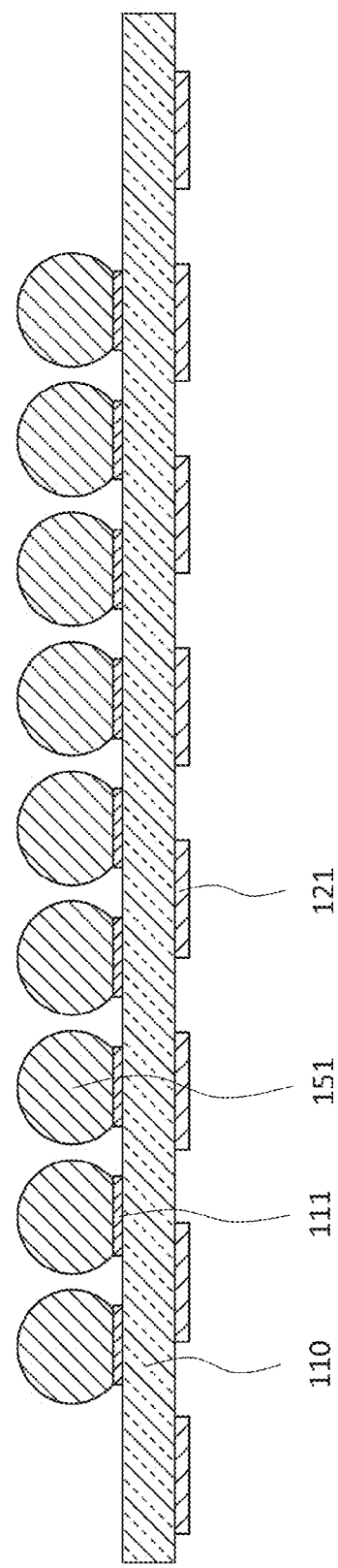
FIG. 14 is a cross-sectional view (2) of the process of manufacturing the electrical apparatus according to the second embodiment.

As illustrated in FIG. 14, the Cu electrodes 111 composed mainly of Cu are formed on a surface of the interposer 110 by the electroless plating method. The Cu electrodes 121 composed mainly of Cu are formed on the other surface of the interposer 110 by the electroless plating method. As in the Cu electrode 12 on the semiconductor device 11 in the first embodiment, a barrier metal film may be formed. The barrier metal film 115 on the Cu electrode 111 can suppress the diffusion of the connection medium 151 into the Cu electrode 111 and improve the reliability of connection of the first bonding portions 150. The barrier metal film 125 on the Cu electrode 121 can suppress the diffusion of the connection medium 161 into the Cu electrode 121 and improve the reliability of connection of the second bonding portions 160. In the method for manufacturing the electrical apparatus according to the second embodiment described below, the barrier metal films on the Cu electrode 111 and the Cu electrode 121 are omitted in the figures for the sake of simplicity.

The connection medium for primary mounting 151 composed of a Sn-58Bi alloy having a melting point of 138° C. is formed on the Cu electrodes 111 by the electroless plating method or by an electroplating method using the barrier metal film as a seed layer. In the case that the connection medium for primary mounting 151 is formed by the electroplating method, the seed layer is removed after the connection medium for primary mounting 151 is formed.

Figure 15:
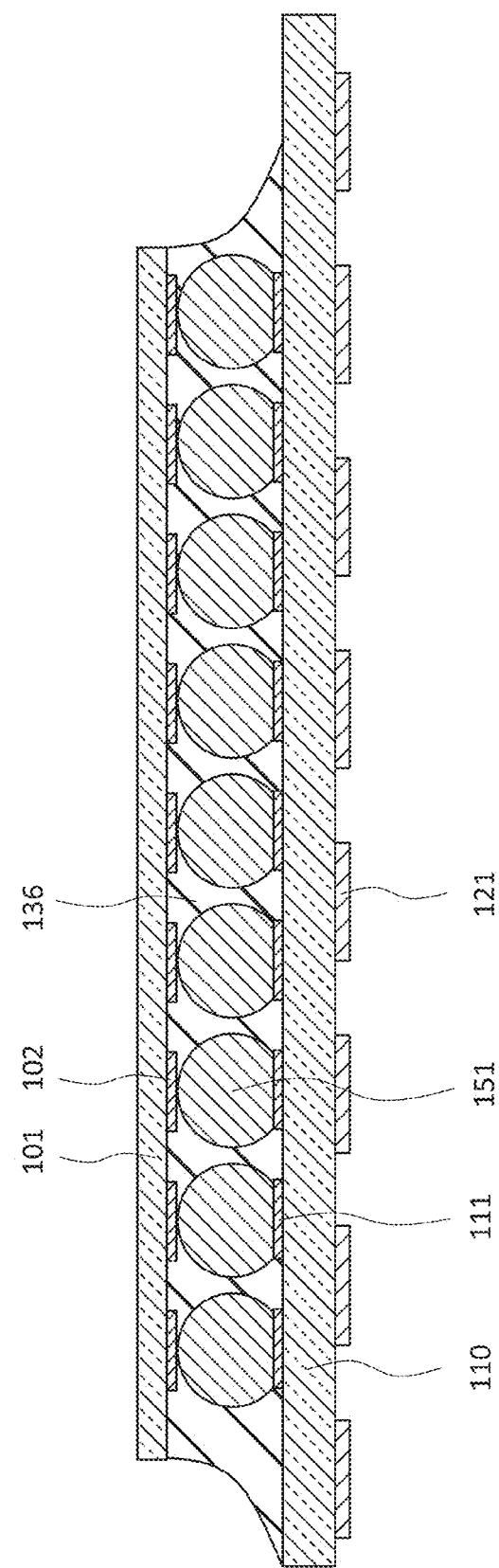
FIG. 15 is a cross-sectional view (3) of the process of manufacturing the electrical apparatus according to the second embodiment.

As illustrated in FIG. 15, while the semiconductor device 101 in FIG. 13 is held with a flip chip bonder (not illustrated), the electrodes 102 of the semiconductor device 101 and the electrodes 111 of the interposer 110 are properly positioned. A flux 136 is then applied to the interposer 110 to temporarily attach the semiconductor device 101 to the interposer 110.

Figure 16:
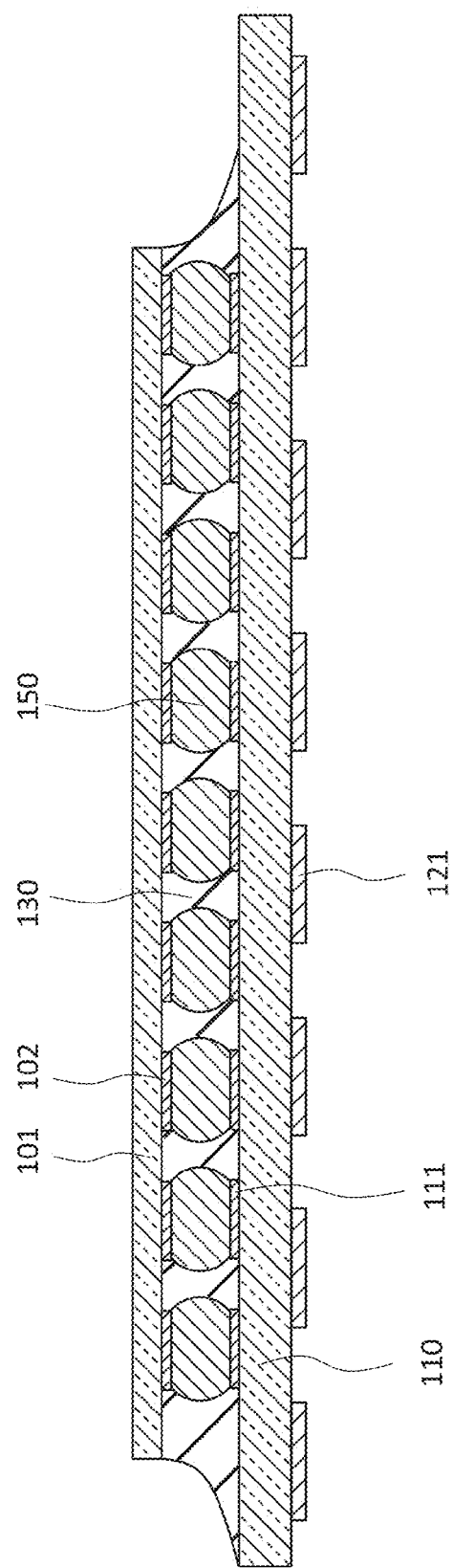
FIG. 16 is a cross-sectional view (4) of the process of manufacturing the electrical apparatus according to the second embodiment.

As illustrated in FIG. 16, the connection medium for primary mounting 151 composed of a Sn-58Bi alloy is then reflowed at a temperature not less than the melting point (138° C.) of the Sn-58Bi alloy, for example, in the range of 160° C. to 180° C. to bond the semiconductor device 101 to the interposer 110. After the semiconductor device 101 and the interposer 110 are bonded together, in the same manner as in the first embodiment, the flux 136 is removed, and the underfill 130 is poured therebetween. The underfill 130 between the semiconductor device 101 and the interposer 110 increases the bonding strength therebetween and improves the reliability of connection of the electrical apparatus 100. Thus, the primary mounting is completed.

Figure 17:
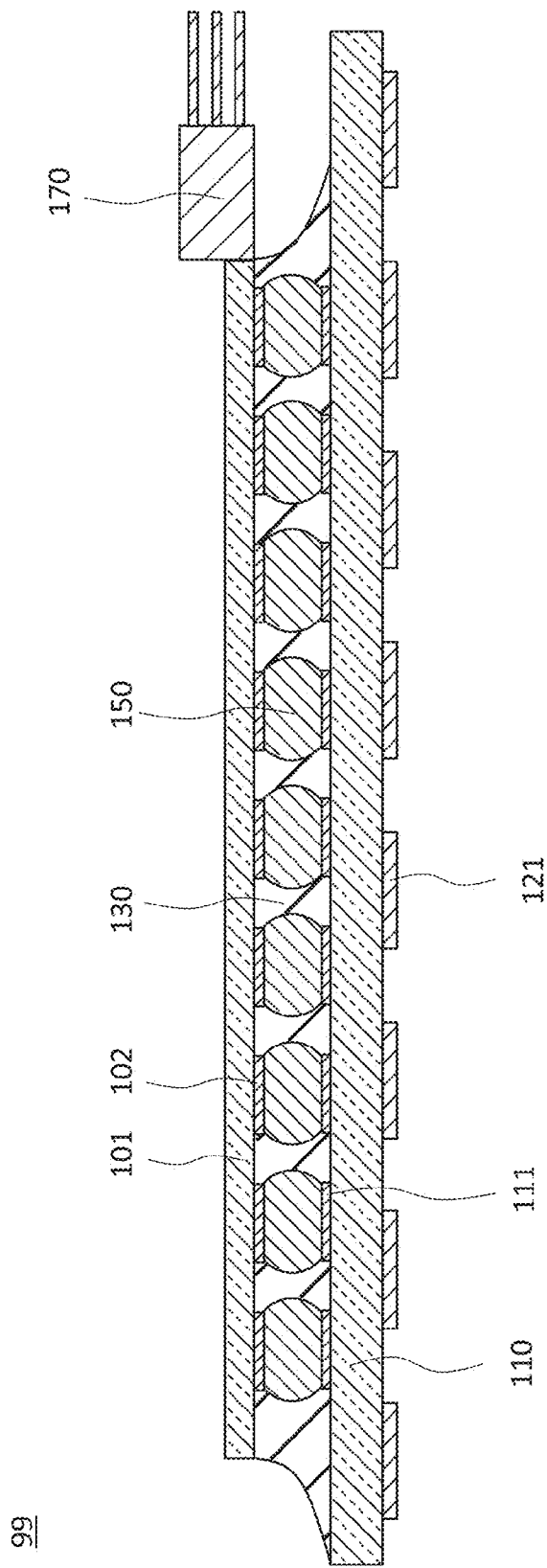
FIG. 17 is a cross-sectional view (5) of the process of manufacturing the electrical apparatus according to the second embodiment.

As illustrated in FIG. 17, the optical component 170 is bonded to the semiconductor device 110 with an optical adhesive (not illustrated). The optical component 170 is bonded to the semiconductor device 110 by curing the optical adhesive by ultraviolet irradiation.

Figure 18:
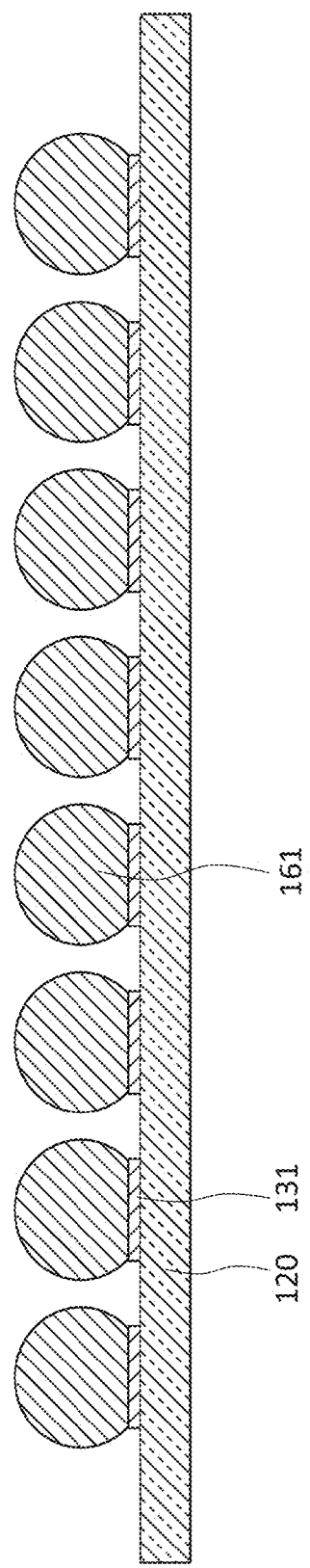
FIG. 18 is a cross-sectional view (6) of the process of manufacturing the electrical apparatus according to the second embodiment.

As illustrated in FIG. 18, the Cu electrodes 131 composed mainly of Cu are formed on a surface of the circuit board 120 by the electroless plating method. As in the Cu electrode 12 on the semiconductor device 11 in the first embodiment, a barrier metal film may be formed. The barrier metal film 135 on the Cu electrode 131 can suppress the diffusion of the connection medium 161 into the Cu electrode 131 and improve the reliability of connection of the second bonding portions 160. In the method for manufacturing the electrical apparatus according to the second embodiment described below, the barrier metal film on the Cu electrode 131 is omitted in the figures for the sake of simplicity.

The connection medium for secondary mounting 161 composed of In—Sn—Ag and having a thickness in the range of approximately 10 to 15 μm is deposited on the Cu electrode 131. The connection medium for secondary mounting 161 composed of In—Sn—Ag preferably contains not less than 43% and not more than 60% by weight In and not more than 3% by weight Ag. When the connection medium for secondary mounting 161 composed of In—Sn—Ag contains not less than 43% and not more than 60% by weight In and not more than 3% by weight Ag, the connection medium 161 after reflow can contain more $AgIn_2$ than $Ag_2In$, and the second bonding portions 160 of the electrical apparatus 100 in FIG. 12A has high strength and ductility.

Figure 19:
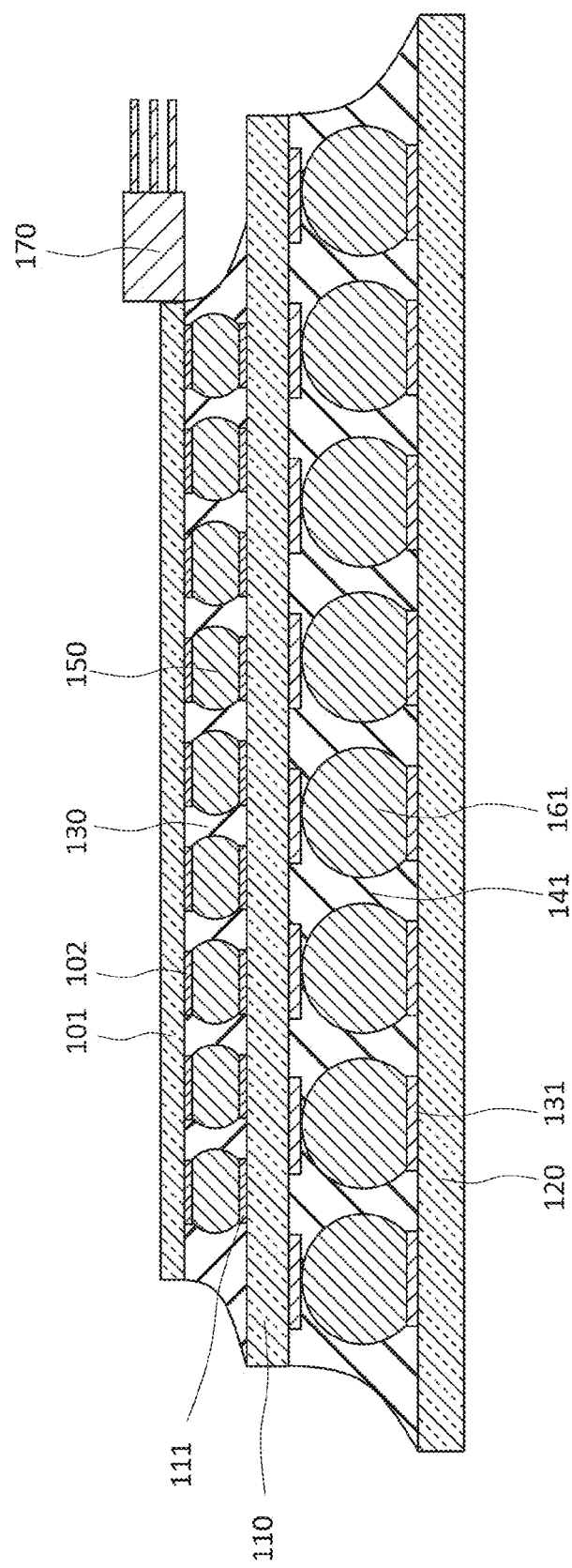
FIG. 19 is a cross-sectional view (7) of the process of manufacturing the electrical apparatus according to the second embodiment.

As illustrated in FIG. 19, while a structure 99 in FIG. 17 in which the semiconductor device 101 and the interposer 110 are bonded together is held with a flip chip bonder (not illustrated), the electrodes 121 of the structure 99 and the electrodes 131 of the circuit board 120 are properly positioned. A flux 141 is then applied to the circuit board 120 to temporarily attach the structure 99 to the circuit board 120.

Figure 20:
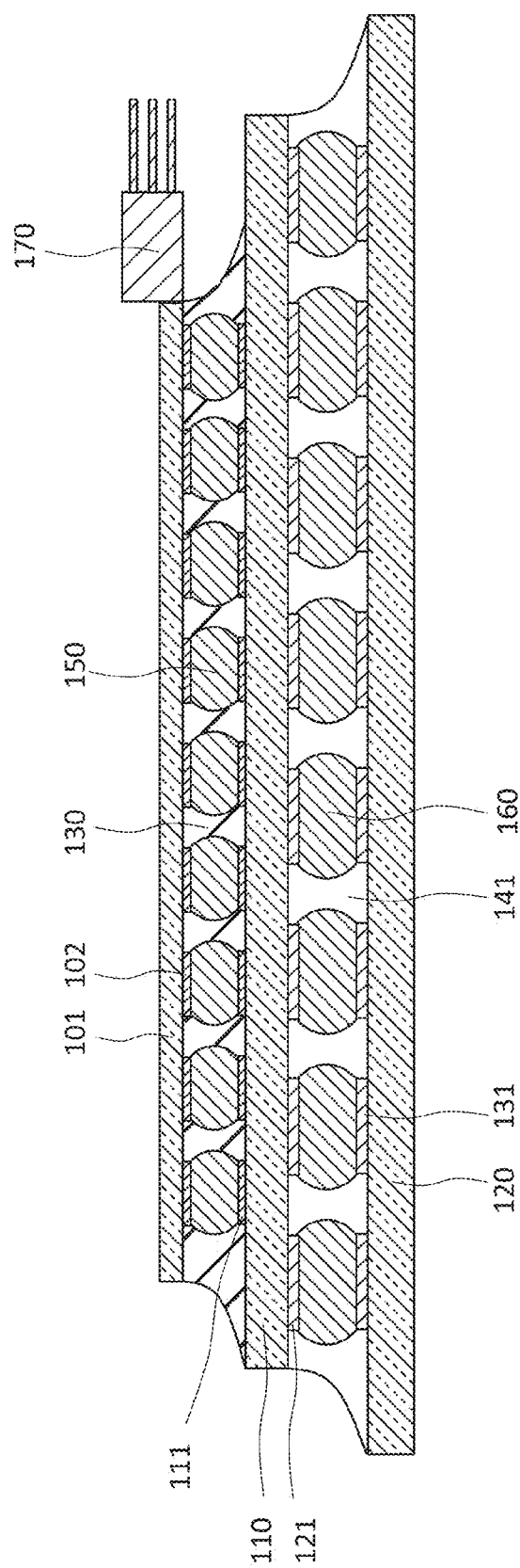
FIG. 20 is a cross-sectional view (8) of the process of manufacturing the electrical apparatus according to the second embodiment.

As illustrated in FIG. 20, the connection medium for secondary mounting 161 composed of the In—Sn—Ag alloy containing not less than 43% and not more than 60% by weight In and not more than 3% by weight Ag is then reflowed at a temperature not less than the melting point (113° C.) of the connection medium for secondary mounting 161, for example, in the range of 115° C. to 130° C. to bond the structure 99 to the circuit board 120. The upper limit temperature of the melting temperatures of the connection medium for secondary mounting 161 is below the melting point of the connection medium for primary mounting 151 used in the primary mounting. Above the melting point of the connection medium for primary mounting 151 used in the primary mounting, the connection medium for primary mounting 151 melts again, resulting in wrong positioning and poor reliability of connection.

After the structure 99 is bonded to the circuit board 120 by reflow, cooling is performed under the cooling conditions described in the first embodiment. More specifically, the average cooling rate at a temperature above the solidus temperature of the connection medium for secondary mounting 161 is preferably not less than 1.0° C./s, for example. The average cooling rate at a temperature below the solidus temperature of the connection medium for secondary mounting 161 may be 0.4° C./s, which is lower than the cooling rate at a temperature above the solidus temperature of the connection medium for secondary mounting 161 (less than 1.0° C./s). Cooling under such cooling conditions results in the $AgIn_2$ content higher than the $Ag_2In$ content of the second bonding portions 160 of the electrical apparatus 100 illustrated in FIG. 11A and high strength and ductility of the second bonding portions 160.

Figure 21:
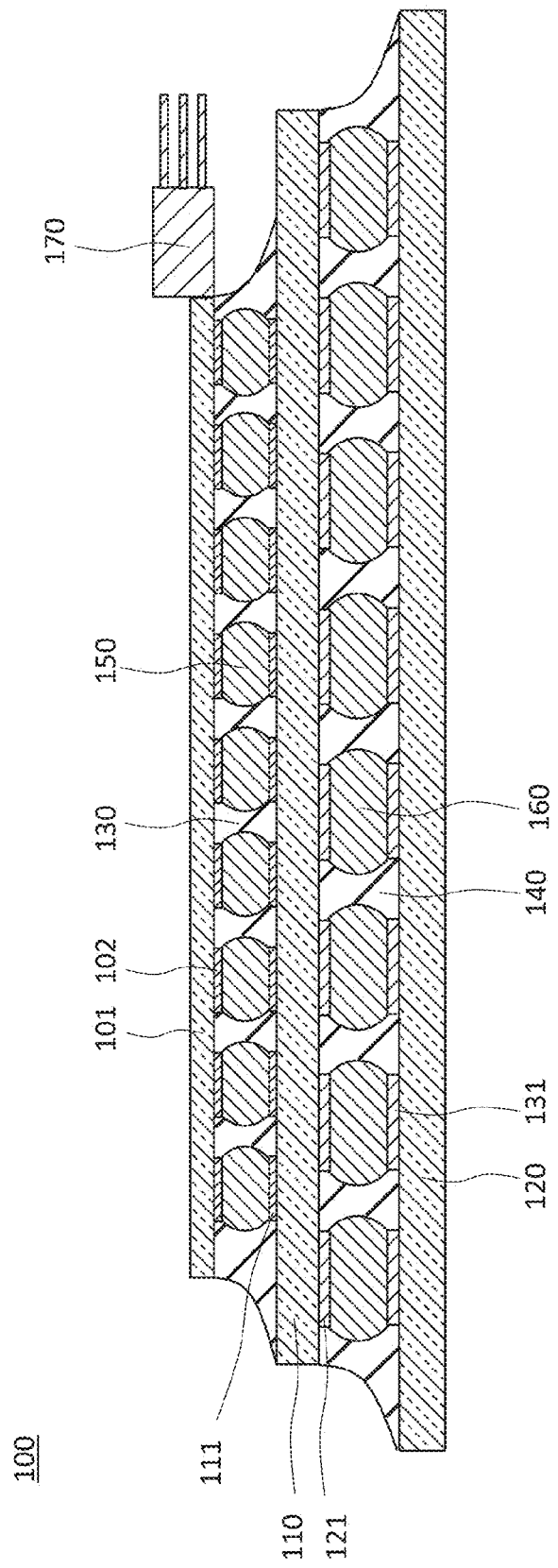
FIG. 21 is a cross-sectional view (9) of the process of manufacturing the electrical apparatus according to the second embodiment.

After the step illustrated in FIG. 20, the flux 141 is removed, and the underfill 140 is poured. Thus, the electrical apparatus 100 illustrated in FIG. 21 is completed. The underfill 140 between the interposer 110 and the circuit board 120 increases the bonding strength therebetween and improves the reliability of connection of the electrical apparatus 100. The foregoing is the method for manufacturing the electrical apparatus 100 according to the second embodiment.

As described above, in the electrical apparatus 100 according to the second embodiment, a bonding portion between electrical components is composed of an In—Sn—Ag alloy having a melting point of approximately 113° C. and having a lower $Ag_2In$ content than the $AgIn_2$ content. The electrical components can therefore be bonded together by reflow at low temperatures. This decreases warping of the electrical components, and the bonding portion has high ductility and strength even under impacts or stress. Thus, the bonding portion has no defects, such as cracks, and the electrical apparatus has high reliability of connection. Furthermore, for example, when electrical components including a component having low heat resistance, such as an optical component, are bonded in stages, an electrical apparatus having high reliability of connection can be manufactured without thermally affecting the optical component and the electrical components.

The embodiments discussed herein are not limiting and may be variously changed without departing from the gist of the embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electrical An apparatus, comprising:
   a first electrical component;
   a second electrical component; and
   an In—Sn—Ag alloy connecting the first electrical component and the second electrical component, the In—Sn—Ag alloy containing $AgIn_2$ and $Ag_2In$, a $Ag_2In$ content being lower than a $AgIn_2$ content.

2. The electrical apparatus according to claim 1, further comprising:
   a first electrode provided at the first electrical component; and
   a second electrode provided at the second electrical component, the In—Sn—Ag alloy connecting the first electrode and the second electrode.

3. The electrical apparatus according to claim 1,
   wherein the In—Sn—Ag alloy contains not less than 43% by weight and not more than 60% by weight In.

4. The electrical apparatus according to claim 1,
   wherein the In—Sn—Ag alloy contains not more than 3% by weight Ag.

5. The electrical apparatus according to claim 1, further comprising:
   a third electrical component; and
   an alloy connecting the second electrical component and the third electrical component, the alloy being made of a material different from the In—Sn—Ag alloy.

6. The electrical apparatus according to claim 5, further comprising:
   a third electrode provided at the third electrical component, the alloy connecting the second electrode and the third electrode.

7. The electrical apparatus according to claim 5,
   wherein a melting point of the material different from the In—Sn—Ag alloy is higher than a melting point of the In—Sn—Ag alloy.

8. The electrical apparatus according to claim 1,
   wherein the first electrical component is a semiconductor device, and the second electrical component is a circuit board.

9. The electrical apparatus according to claim 1,
   wherein the first electrical component is a semiconductor device, and the second electrical component is a package substrate.

10. The electrical apparatus according to claim 1,
    wherein the first electrical component is a semiconductor device, and the second electrical component is an interposer.

11. The electrical apparatus according to claim 1,
    wherein the first electrical component is a package substrate, and the second electrical component is a circuit board.

12. The electrical apparatus according to claim 1,
    wherein the first electrical component is an interposer, and the second electrical component is a package substrate.

13. The electrical apparatus according to claim 9, wherein the third electrical component is a circuit board.
14. The electrical apparatus according to claim 10, wherein the third electrical component is a circuit board.
15. The electrical apparatus according to claim 12, wherein the third electrical component is a circuit board.
16. The electrical apparatus according to claim 8, wherein the third electrical component is a package substrate.
17. The electrical apparatus according to claim 10, wherein the third electrical component is a package substrate.

* * * * *